US012068205B2

(12) United States Patent
Gardner et al.

(10) Patent No.: US 12,068,205 B2
(45) Date of Patent: Aug. 20, 2024

(54) 3D HIGH DENSITY COMPACT METAL FIRST APPROACH FOR HYBRID TRANSISTOR DESIGNS WITHOUT USING EPITAXIAL GROWTH

(71) Applicant: Tokyo Electron Limited, Tokyo (JP)

(72) Inventors: Mark I. Gardner, Albany, NY (US); H. Jim Fulford, Albany, NY (US); Partha Mukhopadhyay, Albany, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 344 days.

(21) Appl. No.: 17/524,668

(22) Filed: Nov. 11, 2021

(65) Prior Publication Data

US 2023/0147116 A1    May 11, 2023

(51) Int. Cl.
| | |
|---|---|
| *H01L 21/8238* | (2006.01) |
| *H01L 21/822* | (2006.01) |
| *H01L 21/8234* | (2006.01) |
| *H01L 27/06* | (2006.01) |
| *H01L 27/092* | (2006.01) |
| *H01L 29/66* | (2006.01) |

(52) U.S. Cl.
CPC .. *H01L 21/823885* (2013.01); *H01L 21/8221* (2013.01); *H01L 27/0688* (2013.01); *H01L 27/0922* (2013.01); *H01L 29/66666* (2013.01); *H01L 21/823487* (2013.01)

(58) Field of Classification Search
CPC ......... H01L 21/8221; H01L 21/823487; H01L 21/823885; H01L 27/0688; H01L 27/092; H01L 27/0922; H01L 29/66666; H01L 29/7827; H01L 29/78642
See application file for complete search history.

(56) References Cited

U.S. PATENT DOCUMENTS

| | | | |
|---|---|---|---|
| 9,024,376 B2 | 5/2015 | Masuoka et al. | |
| 9,425,324 B2 | 8/2016 | Diaz et al. | |
| 9,478,624 B2 | 10/2016 | Colinge et al. | |
| 2016/0005850 A1* | 1/2016 | Zhao | H01L 29/0653 257/329 |
| 2016/0240533 A1* | 8/2016 | Oxland | H01L 29/66742 |
| 2022/0310604 A1* | 9/2022 | Zhang | H01L 21/823821 |
| 2022/0359294 A1* | 11/2022 | Gardner | H01L 27/0688 |
| 2022/0359312 A1* | 11/2022 | Fulford | H01L 29/7827 |
| 2023/0057139 A1* | 2/2023 | Fulford | H01L 21/823885 |

* cited by examiner

*Primary Examiner* — Robert G Bachner
*Assistant Examiner* — Molly K Reida
(74) *Attorney, Agent, or Firm* — Foley & Lardner LLP

(57) ABSTRACT

Methods for the manufacture of three-dimensional (3D) semiconductor devices are disclosed. Aspects can include forming a patterned first conductive source/drain structure of a transistor structure, forming a gate patterned conductive structure of the transistor structure separated from the first conductive source/drain structure by at least one dielectric layer, forming a patterned second conductive source/drain structure of the transistor structure separated from the gate patterned conductive structure by at least one dielectric layer, forming a transistor body opening extending through the transistor structure, forming a gate dielectric in the transistor body opening, and forming a material in the transistor body opening extending from the patterned first conductive source/drain structure to the patterned second conductive source/drain structure.

31 Claims, 32 Drawing Sheets

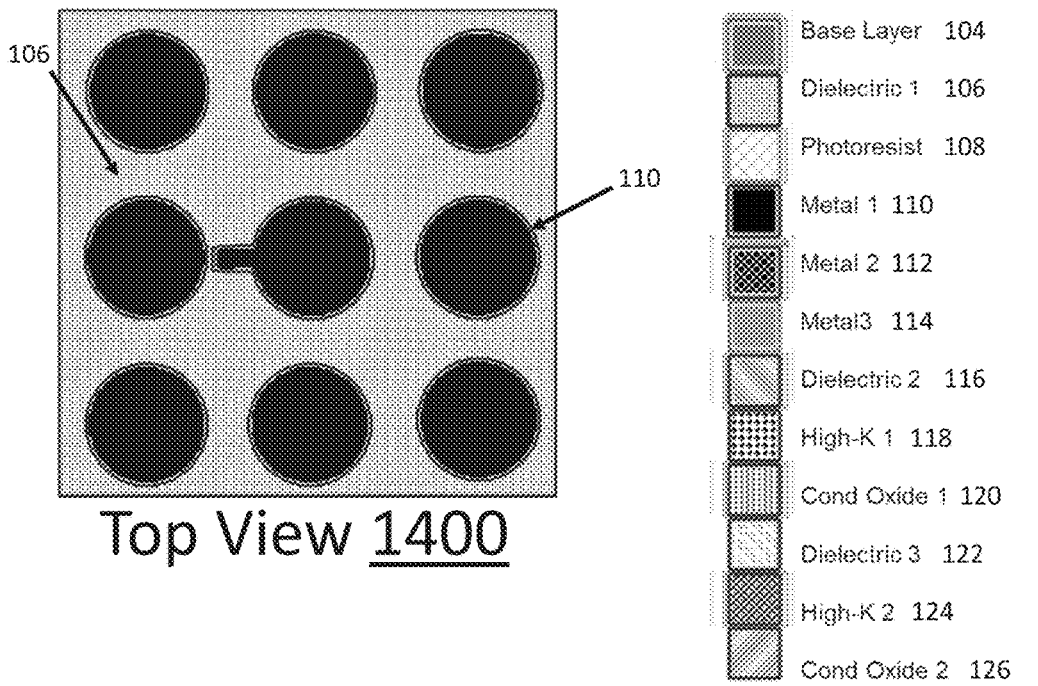
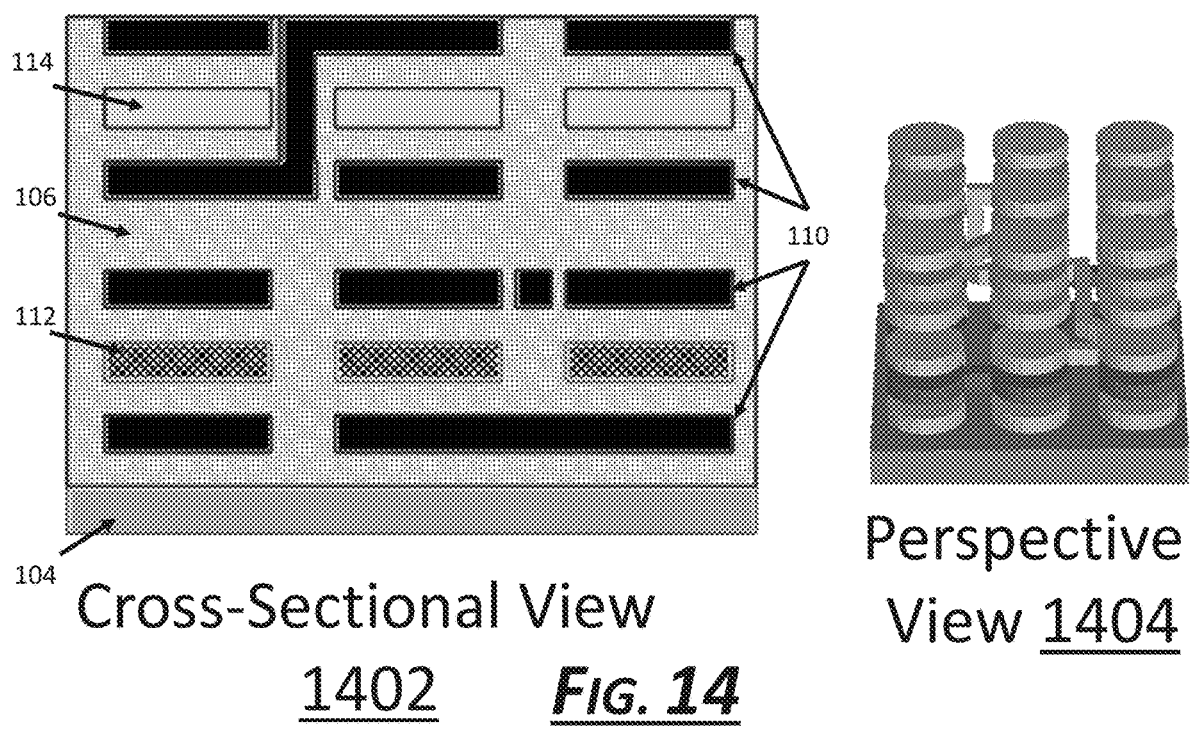
FIG. 14

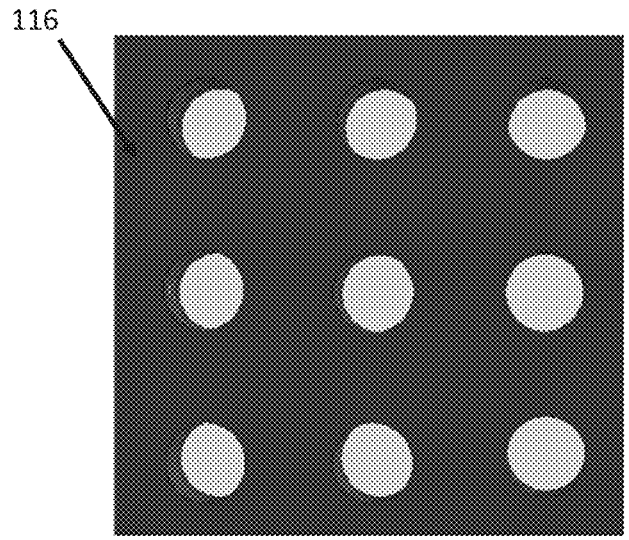
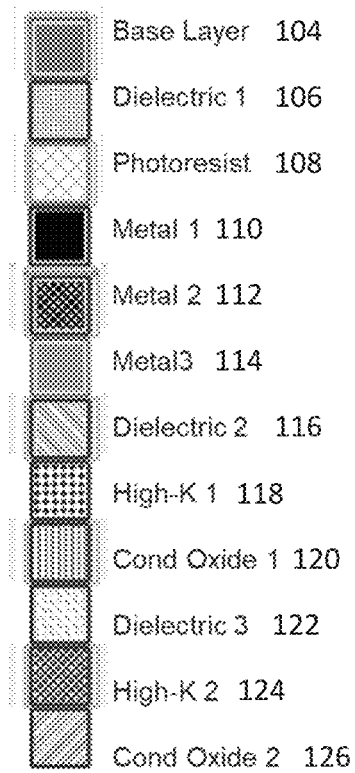
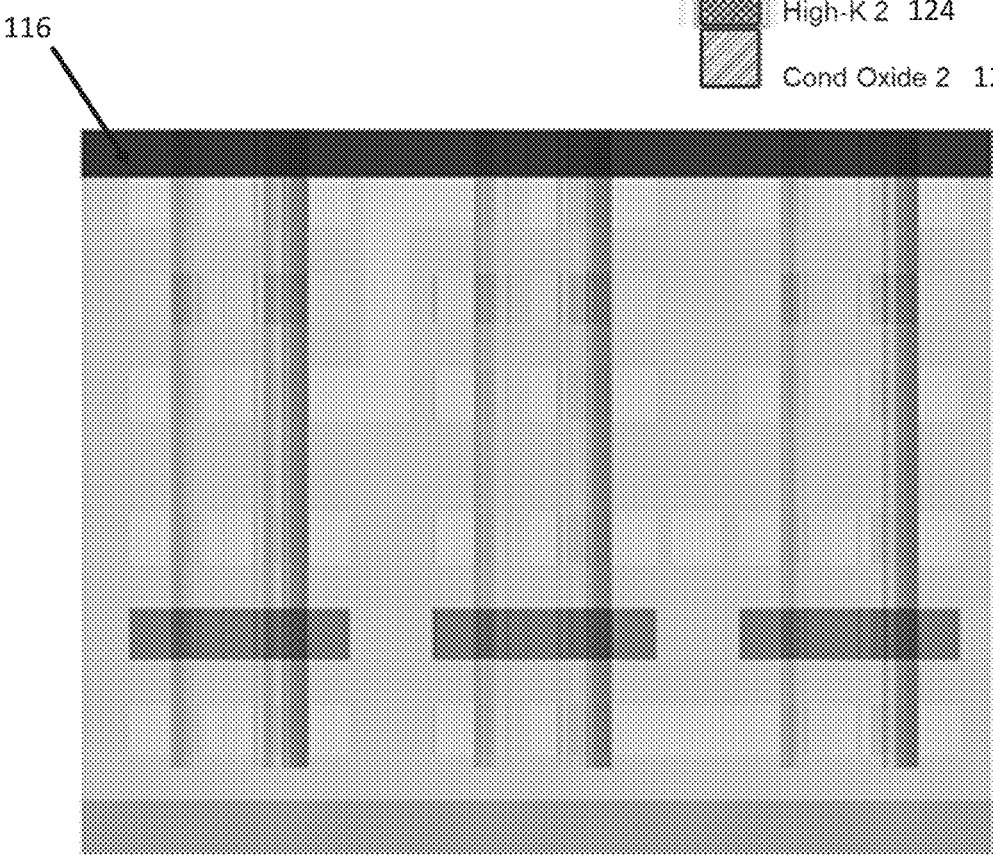
Top View 1500
Cross-Sectional View 1502
FIG. 15

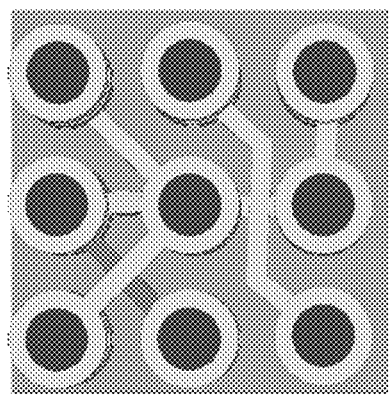
Top View 1604
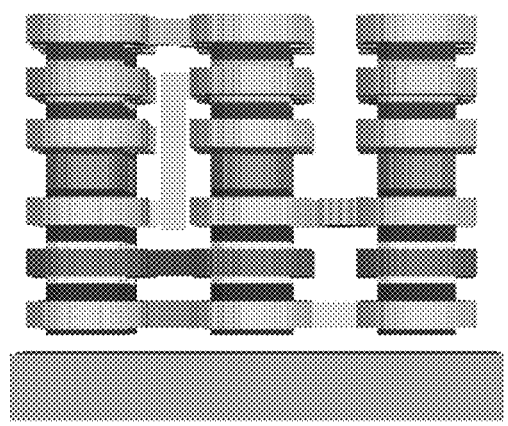
Side View 1606
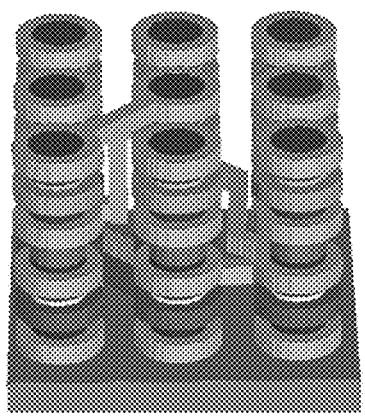
Perspective View 1608
*FIG. 16B*

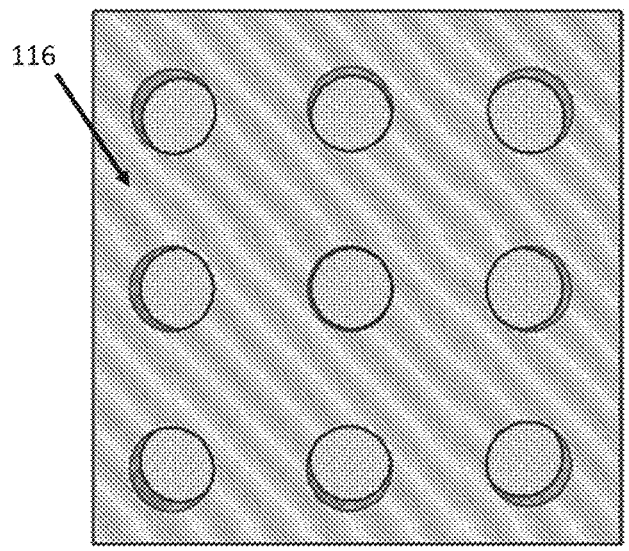
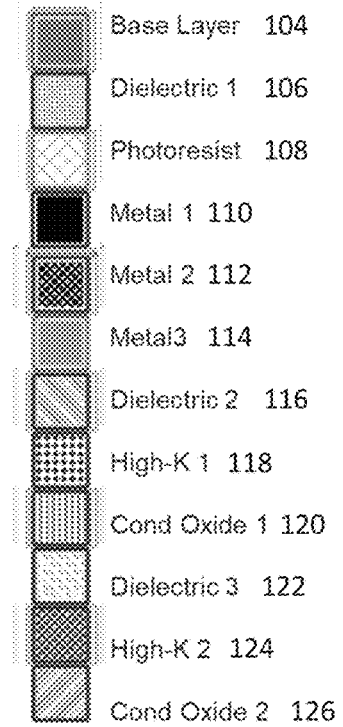
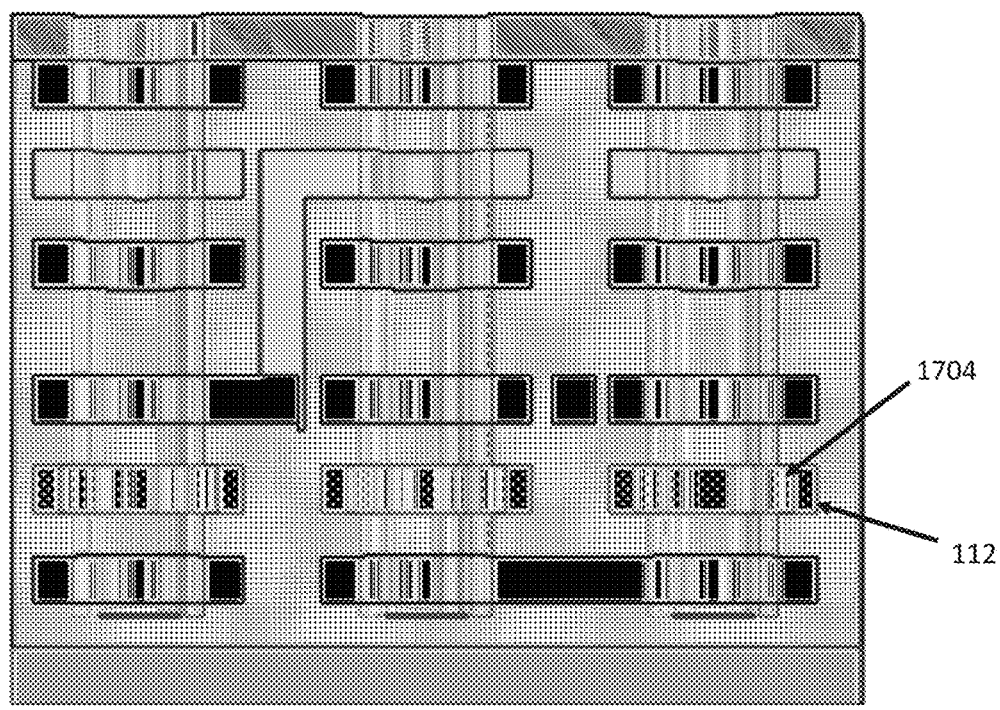
FIG. 17

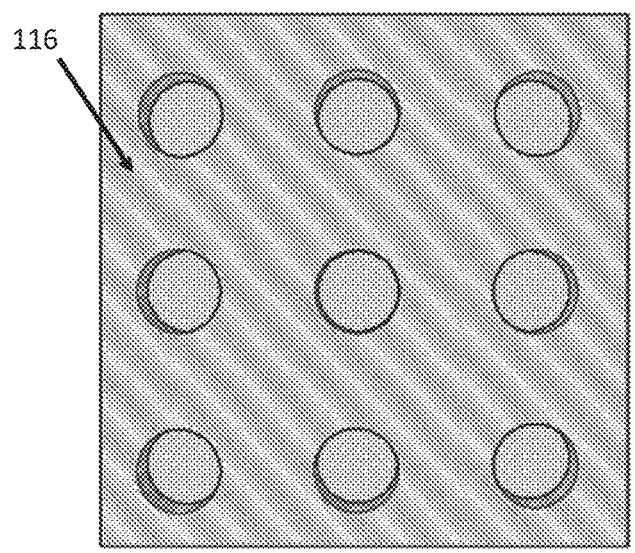
Top View 1800
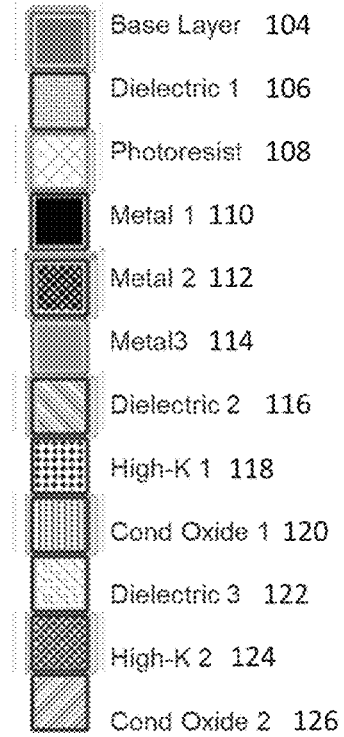
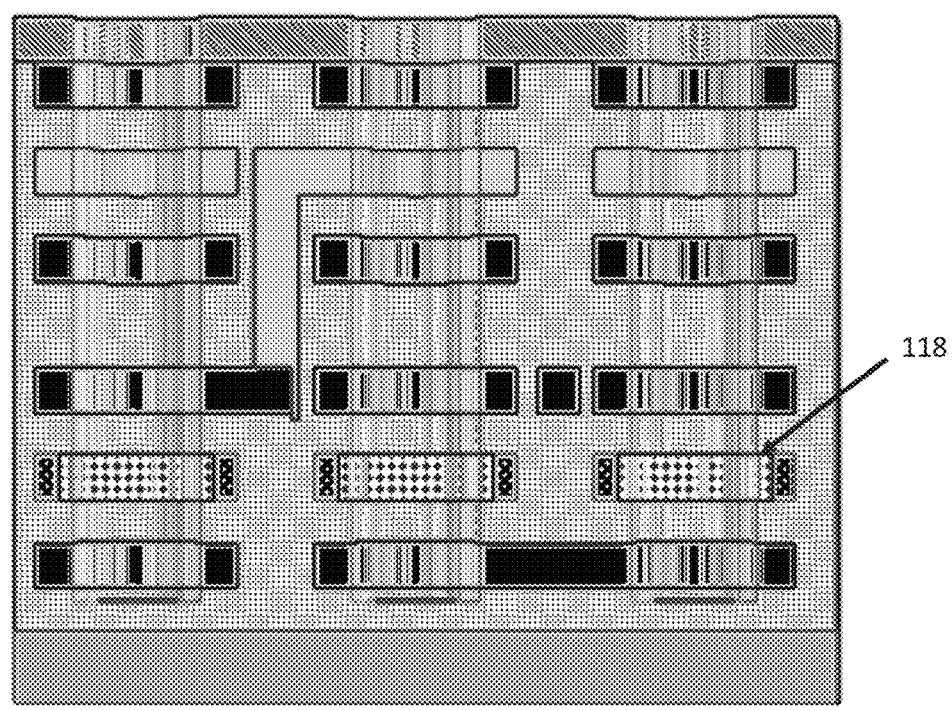
Cross-Sectional View 1802
FIG. 18

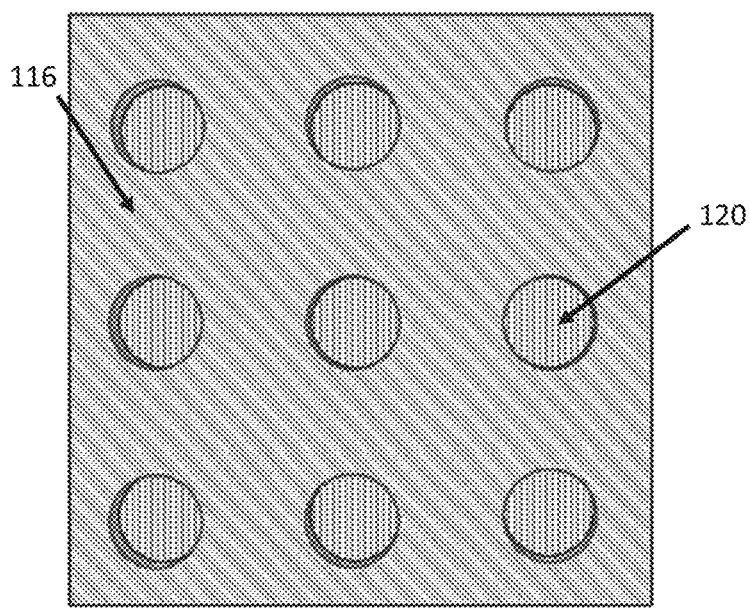
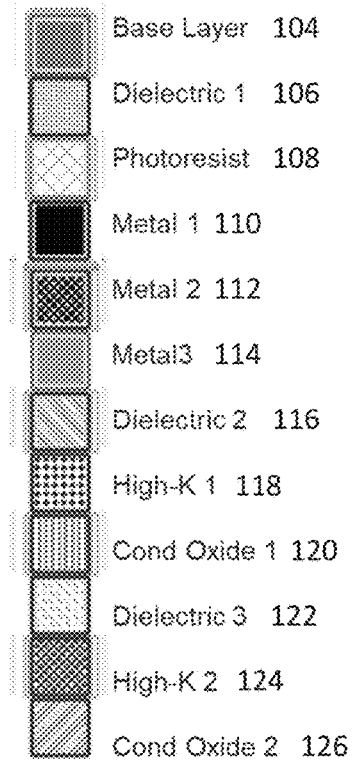
Top View 1900
Cross-Sectional View 1902
FIG. 19

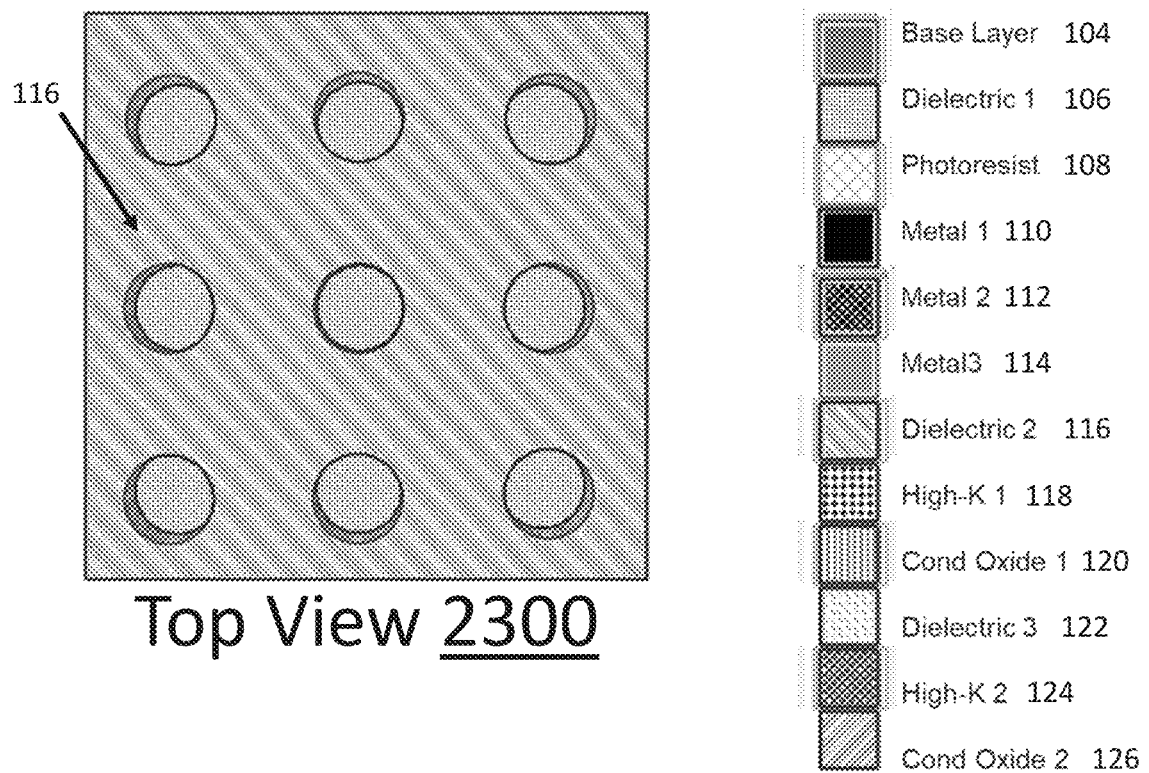
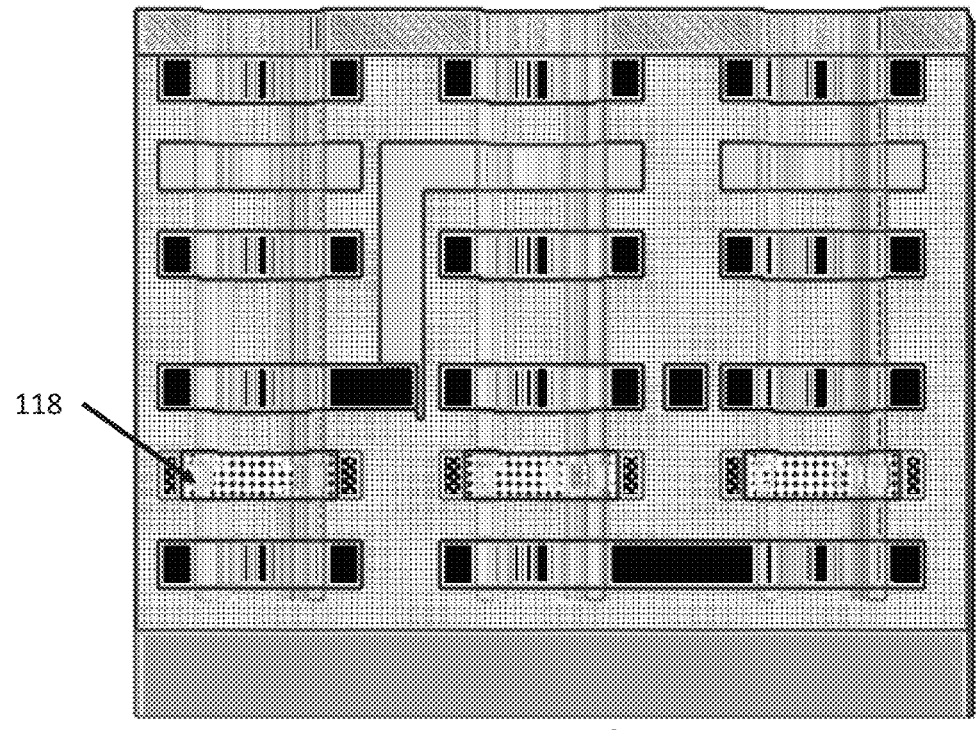
FIG. 23

2900

Form a first transistor structure including a patterned first conductive source/drain structure, a gate patterned conductive structure separated from the patterned first conductive source/drain structure by at least one dielectric layer, and a patterned second conductive source/drain structure separated from the gate patterned conductive structure by at least one dielectric layer  2905

Form a second transistor structure including a patterned third conductive source/drain structure, a second gate patterned conductive structure separated from the patterned third conductive source/drain structure by at least one dielectric layer, and a patterned fourth conductive source/drain structure separated from the second gate patterned conductive structure by at least one dielectric layer 2910

Form a transistor body opening extending through the first and second transistor structures 2915

Form a gate dielectric in the transistor body opening 2920

Form a material in the transistor body opening extending from the patterned first conductive source/drain structure to the patterned second conductive source/drain structure 2925

```
┌─────────────────────────────────────────────────────────────┐
│ Form contacts of at least two patterned transistor           │
│ structures, wherein first contacts of a first patterned      │
│ transistor structure and second contacts of a second         │
│ patterned transistor structure are axially-aligned           │
│ 3105                                                         │
└─────────────────────────────────────────────────────────────┘
                              ↓
┌─────────────────────────────────────────────────────────────┐
│ Form a channel opening extending through the at least two    │
│ patterned transistor structures 3110                         │
└─────────────────────────────────────────────────────────────┘
                              ↓
┌─────────────────────────────────────────────────────────────┐
│ Form a gate dielectric associated with a contact of the      │
│ first contacts 3015                                          │
└─────────────────────────────────────────────────────────────┘
                              ↓
┌─────────────────────────────────────────────────────────────┐
│ Form a gate dielectric associated with a contact of the      │
│ second contacts 3120                                         │
└─────────────────────────────────────────────────────────────┘
                              ↓
┌─────────────────────────────────────────────────────────────┐
│ Form a first material in the channel opening aligned with    │
│ the first contacts 3125                                      │
└─────────────────────────────────────────────────────────────┘
                              ↓
┌─────────────────────────────────────────────────────────────┐
│ Form a second material in the channel opening aligned with   │
│ the second contacts 3130                                     │
└─────────────────────────────────────────────────────────────┘
```

*FIG. 31*

3D HIGH DENSITY COMPACT METAL FIRST APPROACH FOR HYBRID TRANSISTOR DESIGNS WITHOUT USING EPITAXIAL GROWTH

TECHNICAL FIELD

The present invention relates generally to the field of manufacturing semiconductor devices.

BACKGROUND

In the manufacture of a semiconductor devices (especially on the microscopic scale), various fabrication processes are executed, such as film-forming depositions, etch mask creation, patterning, material etching and removal, and doping treatments. These processes are performed repeatedly to form desired semiconductor device elements on a substrate. Conventional micro microfabrication techniques only manufacture transistors in one plane, while wiring or metallization is formed above the active device plane. Such devices are accordingly characterized as two-dimensional (2D) circuits, manufactured using 2D fabrication techniques. Although scaling efforts have greatly increased the number of transistors per unit area in 2D circuits, these 2D fabrication techniques are approaching physical atomic limitations with single digit nanometer semiconductor device fabrication nodes. Semiconductor device fabricators have expressed a desire for different manufacturing techniques and configurations of devices to increase density of semiconductor circuitry.

SUMMARY 3D integration, e.g., a stacking (or vertical arrangement) of multiple semiconductor devices (e.g., transistor structures), aims to overcome scaling limitations experienced in planar devices by increasing transistor density in volume rather than area. Although device stacking has been successfully demonstrated and implemented by the flash memory industry with the adoption of 3D NAND, applying similar techniques to random logic designs is substantially more difficult. 3D integration for logic chips, including central processing units (CPU), graphics processing units (GPU), and field-programmable gate arrays (FPGA) are being pursued.

At least one aspect of the present disclosure is directed to a method. The method can include forming a patterned first conductive source/drain structure of a transistor structure. The method can include forming a gate patterned conductive structure of the transistor structure separated from the first conductive source/drain structure by at least one dielectric layer. The method can include forming a patterned second conductive source/drain structure of the transistor structure separated from the gate patterned conductive structure by at least one dielectric layer. The method can include forming a transistor body opening extending through the transistor structure. The method can include forming a gate dielectric in the transistor body opening. The method can include forming a material in the transistor body opening extending from the patterned first conductive source/drain structure to the patterned second conductive source/drain structure.

In some implementations, the gate dielectric has a first surface along a sidewall of the transistor body opening and at least partially adjacent the gate patterned conductive structure. In some implementations, forming the gate dielectric includes recessing the gate patterned conductive structure to form a recess and depositing the gate dielectric in the recess. In some implementations, the gate dielectric has a first surface adjacent the gate patterned conductive structure and a second surface aligned with a surface of the transistor body opening.

In some implementations, the gate dielectric is selectively formed. In some implementations, the method can include forming a connection between the gate patterned conductive structure to a patterned conductive source/drain structure of a second transistor structure before forming the material. In some implementations, the method can include forming a connection between the gate patterned conductive structure to a gate patterned structure of a second transistor structure before forming the material.

In some implementations, the method can include forming a connection between the patterned first conductive source/drain structure to a patterned conductive source/drain structure of a second transistor structure before forming the material. In some implementations, the method can include forming a second transistor structure, wherein the transistor body opening extends through the transistor structure and the second transistor structure. In some implementations, the material is a semiconductive-behaving oxide.

At least one other aspect is directed to another method. The method can include forming a first transistor structure. The first transistor structure can include a patterned first conductive source/drain structure. The first transistor structure can include a gate patterned conductive structure separated from the patterned first conductive source/drain structure by at least one dielectric layer. The first transistor structure can include a patterned second conductive source/drain structure separated from the gate patterned conductive structure by at least one dielectric layer. The method can include forming a second transistor structure. The second transistor structure can include a patterned third conductive source/drain structure. The second transistor structure can include a second gate patterned conductive structure separated from the patterned third conductive source/drain structure by at least one dielectric layer. The second transistor structure can include a patterned fourth conductive source/drain structure separated from the second gate patterned conductive structure by at least one dielectric layer. The method can include forming a transistor body opening extending through the first and second transistor structures. The method can include forming a gate dielectric in the transistor body opening. The method can include forming a material in the transistor body opening extending from the patterned first conductive source/drain structure to the patterned second conductive source/drain structure.

In some implementations, the gate dielectric has a first surface along a sidewall of the transistor body opening and at least partially adjacent the gate patterned conductive structure. In some implementations, forming the gate dielectric includes recessing the gate patterned conductive structure to form a recess and depositing the gate dielectric in the recess. In some implementations, the gate dielectric has a first surface adjacent the gate patterned conductive structure and a second surface aligned with a surface of the transistor body opening. In some implementations, the gate dielectric is selectively formed.

In some implementations, the method can include forming a connection between the gate patterned conductive structure to a patterned conductive source/drain structure of a third transistor structure before forming the material. In some implementations, the method can include forming a connection between the gate patterned conductive structure to a gate patterned structure of a third transistor structure before forming the material. In some implementations, the method can include forming a connection between the patterned first conductive source/drain structure to a patterned conductive source/drain structure of a third transistor structure before forming the material. In some implementations, the material is a semiconductive-behaving oxide.

At least one other aspect of the present disclosure is directed to another method. The method can include forming a first source/drain contact in a first dielectric layer. The method can include forming a gate contact in a second dielectric layer. The method can include forming a second source/drain contact in a third dielectric layer. The method can include forming a channel opening extending from at least the first source/drain contact to the second source/drain contact. The method can include forming a gate dielectric in the channel opening. The method can include forming a first material in the channel opening extending from the first source/drain contact to the second source/drain contact.

In some implementations, forming the channel opening comprises etching through a dielectric surrounded by the first source/drain contact, a dielectric surrounded by the gate contact, and a dielectric surrounded by the second source/drain contact. In some implementations, forming the channel opening comprises etching through a first dielectric region of the first dielectric layer, a second dielectric region of the second dielectric layer, and a third dielectric region of the third dielectric layer.

In some implementations, forming the channel opening comprises etching through the first source/drain contact, the gate contact, and the second source/drain contact. In some implementations, the method can include forming a connection between the first source/drain contact or the gate contact and a third source/drain contact or a second gate contact. In some implementations, the method can include forming a connection between the first source/drain contact or the first gate contact and the third source/drain contact or the second gate contact.

At least one other aspect of the present disclosure is directed to a method. The method can include forming contacts of at least two patterned transistor structures, wherein first contacts of a first patterned transistor structure and second contacts of a second patterned transistor structure are axially-aligned. The method can include forming a channel opening extending through the at least two patterned transistor structures. The method can include forming a gate dielectric associated with a contact of the first contacts. The method can include forming a gate dielectric associated with a contact of the second contacts. The method can include forming a first material in the channel opening aligned with the first contacts. The method can include forming a second material in the channel opening aligned with the second contacts.

In some implementations, the method can include forming a connection between at least one contact of the first contacts and at least one contact of third contacts of a third patterned transistor structure. In some implementations, the first patterned transistor structure and the third patterned transistor structure are axially-aligned. In some implementations, forming the first material is performed after forming the connection. In some implementations, forming the first contacts comprises depositing the first contacts in respective dielectric layers.

In some implementations, the method can include forming the gate dielectric for the first transistor structure, wherein the gate dielectric has a first surface along a sidewall of the channel opening and at least partially adjacent a gate contact of the first contacts. In some implementations, the gate dielectric has a first surface adjacent a gate contact of the first contacts and a second surface aligned with a surface of the channel opening. In some implementations, forming the gate dielectric includes recessing the contact of the first contacts to form a recess and depositing the gate dielectric in the recess, wherein the gate dielectric has a first surface adjacent the contact and a second surface aligned with a surface of the channel opening.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustration and a further understanding of the various aspects and implementations, and are incorporated in and constitute a part of this specification. Aspects can be combined and it will be readily appreciated that features described in the context of one aspect of the invention can be combined with other aspects. Aspects can be implemented in any convenient form. As used in the specification and in the claims, the singular form of 'a', 'an', and 'the' include plural referents unless the context clearly dictates otherwise.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure. For purposes of simplicity, not every component may be labeled in every drawing. In the drawings:

FIGS. 14, 15, 16A, and 16B show top, cross-sectional, side, and perspective views of a second process flow for forming 3D vertical semiconductor devices, according to an embodiment;

FIGS. 17-21 show top and cross-sectional views of a third process flow for forming 3D vertical semiconductor devices, according to an embodiment;

FIGS. 22-26 show top and cross-sectional views of a fourth process flow for forming 3D vertical semiconductor devices, according to an embodiment; FIGS. 28-31 show flow diagrams of example methods for fabricating transistor structures using the process flows described in connection with FIGS. 1-27, according to an embodiment.

DETAILED DESCRIPTION

Figure 1:
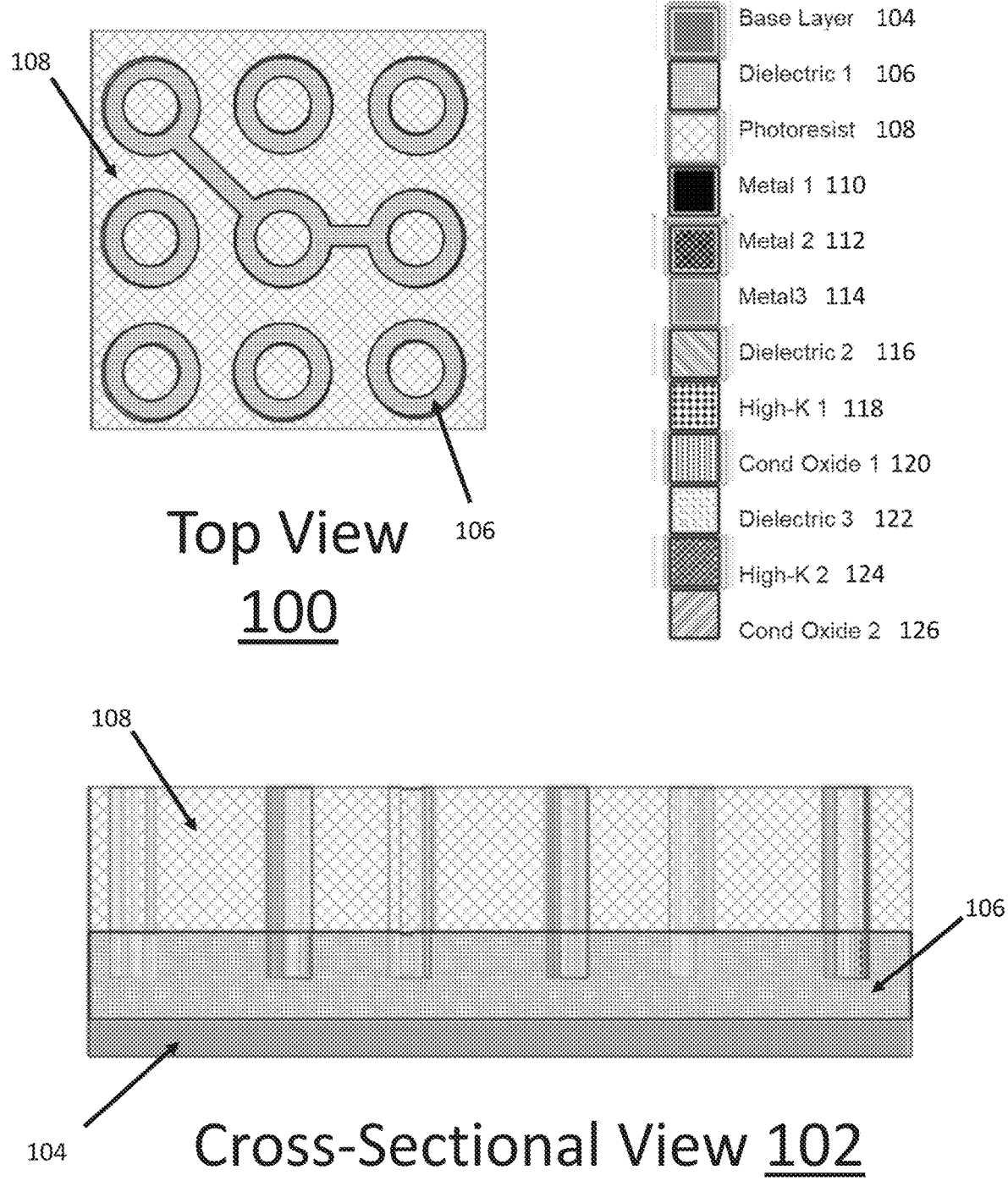
FIGS. 1-13 show top, cross-sectional, and perspective views of a first process flow to form 3D vertical semiconductor devices, according to an embodiment.

Reference will now be made to the illustrative embodiments depicted in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one skilled in the relevant art and having possession of this disclosure, are to be considered within the scope of the subject matter disclosed herein. Other embodiments may be used and/or other changes may be made without departing from the spirit or scope of the present disclosure. The illustrative embodiments described in the detailed description are not meant to be limiting of the subject matter presented.

The embodiments described herein will refer to a deposited channel layer comprising a material such as a conductive oxide to 2D material. However, the channel may alternatively be formed epitaxially with minor modifications to the described process without diverting from the scope of this disclosure. Therefore, a semiconductor substrate is not required, and any base layer may be used instead of a traditional substrate. In addition, these techniques can be implemented using self-aligned high-k gate dielectric regions in few process steps, using a metal-first design. As such, these techniques provide both efficient flow and low Dt. In addition, such techniques can enable N-high stacks of semiconductor devices, thereby allowing for higher circuit density. Some embodiments include 3D stacks of vertical conductive channel nano sheets in both CFET and side-by-side configurations.

The process flows described herein utilize conductive dielectric materials to form 3D channel regions for the definition of NMOS and PMOS devices without using epitaxial growth. As such, the techniques described herein can be manufactured, or "stacked" on any existing vertically stacked device or substrate, such as metal, plastic, or otherwise, according to various implementations. The present techniques may improve upon other semiconductor manufacturing techniques by increasing the N height of stacked semiconductor devices, such as transistors, thereby providing high density logic. The techniques described herein provide processes to manufacture high-k gate dielectrics with relatively few process steps using a metal first design. Although illustrations herein may show an NMOS device arranged over a PMOS device, though the configuration may include a PMOS device over NMOS device, NMOS device over NMOS device, PMOS device over PMOS device, or other alternative including one or more NMOS devices or PMOS devices.

The techniques provided herein can utilize conductive dielectric materials (sometimes referred to herein as "conductive channels"), which may have similar properties to semiconductor materials, to fabricate vertical 3D transistors. For example, certain materials, when combined with oxygen, may form new materials that exhibit semiconductor properties (e.g., it can turn "off" with low off-state leakage current, or can become highly conductive under certain circumstances, etc.). Some examples of N-type conductive channels include $In_2O_3$, $SnO_2$, InGaZnO, and ZnO. One example of a P-type conductive channel is SnO. Additionally or alternatively, the channel may comprise a 2D material. Some example 2D materials for use in forming the channel include, but are not limited to, $WS_2$, $WSe_2$, $WTe_2$, $MoS_2$, $MoSe_2$, $MoTe_2$, $HfS_2$, $ZrS_2$, and $TiS_2$, GaSe, InSe, phosphorene, and other similar materials. These materials may be deposited by an atomic layer deposition (ALD) process and may be 5-15 angstroms thick, the thinness lending to their name—2D material. The materials may be annealed during or after the device formation process to recrystallize or grow the crystals and thereby improve electrical characteristics. For the sake of simplicity, the use of conductive dielectrics will be disclosed.

As described briefly above, the process flows described herein may be implemented utilizing conductive channels to from the 3D channel regions of NMOS and PMOS devices without using epitaxial growth. Accordingly, devices fabricated using these techniques can be stacked on any existing vertically stacked devices, thereby greatly increasing the number of stacked transistors N (e.g., 2, 3, 4, 5 10, 20, 50, 100, or more) for high-density logic. At least one implementation is directed to a metal-first layer for fabricating transistors with conductive oxide layers. Such techniques can utilize pre-aligned masks to improve etching the central trench to fabricate the devices. Larger trench masks can be used to reduce litho-misalignment issues. Another technique, whereby solid-filled metal layers are formed prior to etching the central trench, may also be used to reduce alignment issues. However, an etching process that is capable of etching through metal must be used.

Further, various techniques may be implemented to form the high-k barrier between the conductive channels and the gate electrode. One such technique utilizes a gate-recessing technique to provide a uniform layer of doped conductive oxide material, along with a selective deposition of a high-k dielectric to form the transistor gates. Another, similar technique provides a non-selective deposition of the high-k dielectric, in conjunction with self-aligned directional etching. These techniques may also be implemented to fabricate stacked transistors of the same type by utilizing the same conductive oxide for two or more transistor layers. These and other aspects are described in further detail herein.

Reference will now be made to the figures, which for the convenience of visualizing the 3D fabrication techniques described herein, illustrate a substrate undergoing a process flow in both top and cross-sectional views. Unless expressly indicated otherwise, each Figure represents one (or a set) of fabrication steps in a process flow for manufacturing the devices described herein. In the top and cross-sectional views of the Figures, connections between conductive layers or materials may be shown. However, it should be understood that these connections between various layers and masks are merely illustrative, and are intended to show a capability for providing such connections and should not be considered limiting to the scope of the claims.

Likewise, although the Figures and aspects of the disclosure may show or describe devices herein as having a particular shape, it should be understood that such shapes are merely illustrative and should not be considered limiting to the scope of the techniques described herein. For example, although most of the figures show various layers in a circular (ring) configuration, other shapes are also contemplated, and indeed the techniques described herein may be implemented in any shape or geometry. As an example, noncontinuous contact shapes such as arcs or polygonal trenches, may be adjacent to, partially surround, or fully surround a central channel in addition to or as an alternative to the ring shapes illustrated. In addition, examples in which two transistors or devices are shown stacked on top of one another are shown for illustrative purposes only, and for the purposes of simplicity. Indeed, the techniques described herein may provide for one to any number N stacked devices. Further, although the devices fabricated using these techniques are shown as transistors, it should be understood that any type of electric electronic device may be manufactured using such techniques, including but not limited to transistors, variable resistors, resistors, and capacitors.

FIGS. 1-13 show a metal-first process for fabricating transistors with conductive oxide layers, or other types of electric or electronic devices. Each of the FIGS. 1-13 generally refer to one or more process steps in a process flow, each of which are described in detail in connection with the respective Figure. For the purposes of simplicity and ease of visualization, some reference numbers may be omitted from some Figures. Referring to FIG. 1, illustrated is a top view 100 and a cross-sectional view 102 of a device is shown. At the start of the metal-first process flow, a first layer of dielectric 106 (shown in the legend as the "Dielectric 1") is deposited on top of a base layer 104. As described briefly above, the techniques described herein may be implemented without requiring epitaxial growth, and therefore the base layer 104 may be any type of material capable of binding to the dielectric 106. Likewise, the dielectric 106 may be any type of dielectric material that is capable of being disposed, patterned, or otherwise provided on top of the base layer 104. Some examples of dielectric materials can include, but are not limited to, oxide materials.

As used herein, the terms "first," "second," "third," and "fourth" with respect to particular layers of the stack shown in FIGS. 1-13 refer to the order of the layers relative to the base layer 104. For example, a "first" layer of a particular type refers to the specified type of layer which is closest to the base layer 104. Likewise, a "second" layer of a particular type refers to the specified type of layer which is second closest to the base layer 104, and so on. Once the first layer of dielectric 106 (sometimes referred to herein as a "first dielectric layer") is deposited on top of the base layer 104 a first metal mask of the photoresist 108 is provided over the first layer of dielectric 106 (e.g., using any type of lithographic or masking technique), which is used in patterning and directionally etching the first layer of dielectric 106. As shown in the cross-sectional view 102, the first layer of dielectric 106 can be etched partially, such that the first layer of dielectric 106 still covers the base layer 104. The top view 104 shows how the photoresist layer 108 is patterned to mask regions of the first layer of dielectric 106 that are to include deposits of a first layer of metal 110 (shown as "Metal 1" in the legend) in later process steps. The dielectric 106 can be patterned or etched using any type of suitable etching process, including but not limited to dry etching, wet etching, or plasma etching techniques.

Figure 2:
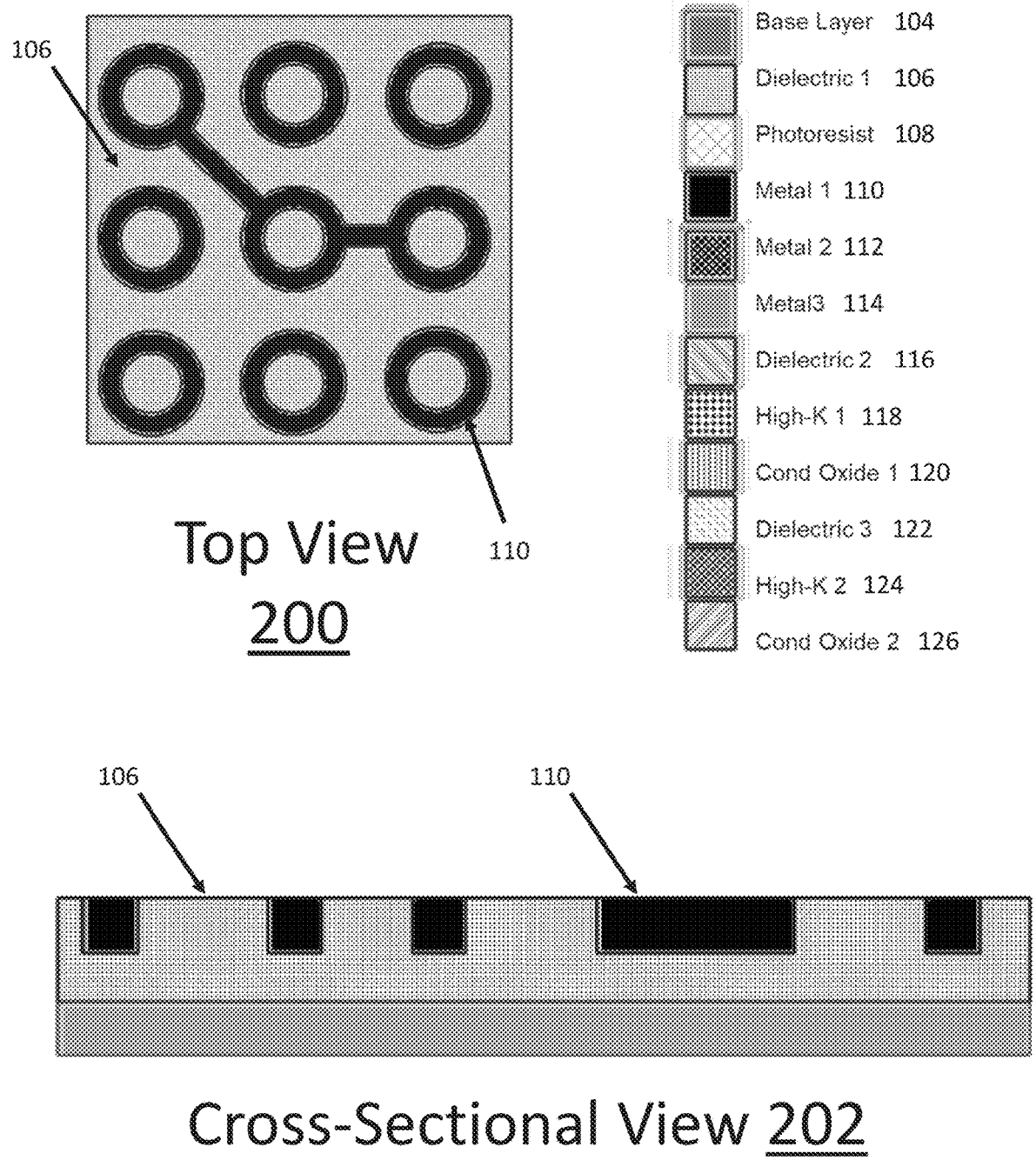

The example flow process continues in FIG. 2, which illustrates a top view 200 and a cross-sectional view 202 of a device following the removal of the photoresist layer and the deposition of a first layer of metal 110. The first layer of metal 110 may be any type of conductive metal suitable to form a source or drain electrode in a semiconductor device, including copper, gold, silver, platinum, nickel, tungsten, ruthenium, or other types of conductive metals or alloys. The first layer of metal 110 may form, for example, a source or drain contact of a vertical transistor device. As shown, in this stage in the process flow, the first photoresist layer 108 of FIG. 1 has been stripped using a suitable stripping technique (e.g., a chemical specific to the photoresist layer 108 that is relative unreactive with the dielectric 106). Once the photoresist layer 108 has been removed, the first layer of metal 110 may be deposit filled into the previously etched portions of the first layer of dielectric 106, as shown in the cross-sectional view 200. The deposition of the first layer of metal 110 can be performed using any type of metal deposition technique, including but not limited to atomic layer deposition (ALD), chemical vapor deposition (CVD), and physical vapor deposition (PVD). A chemical-mechanical polish (CMP) process may be performed such that portions of the first layer of dielectric 106 and the first layer of metal 110 are exposed and polished, as shown in the top-view 200. Generally, CMP processes are used to smooth surfaces with a combination of chemical and mechanical forces.

Figure 3:
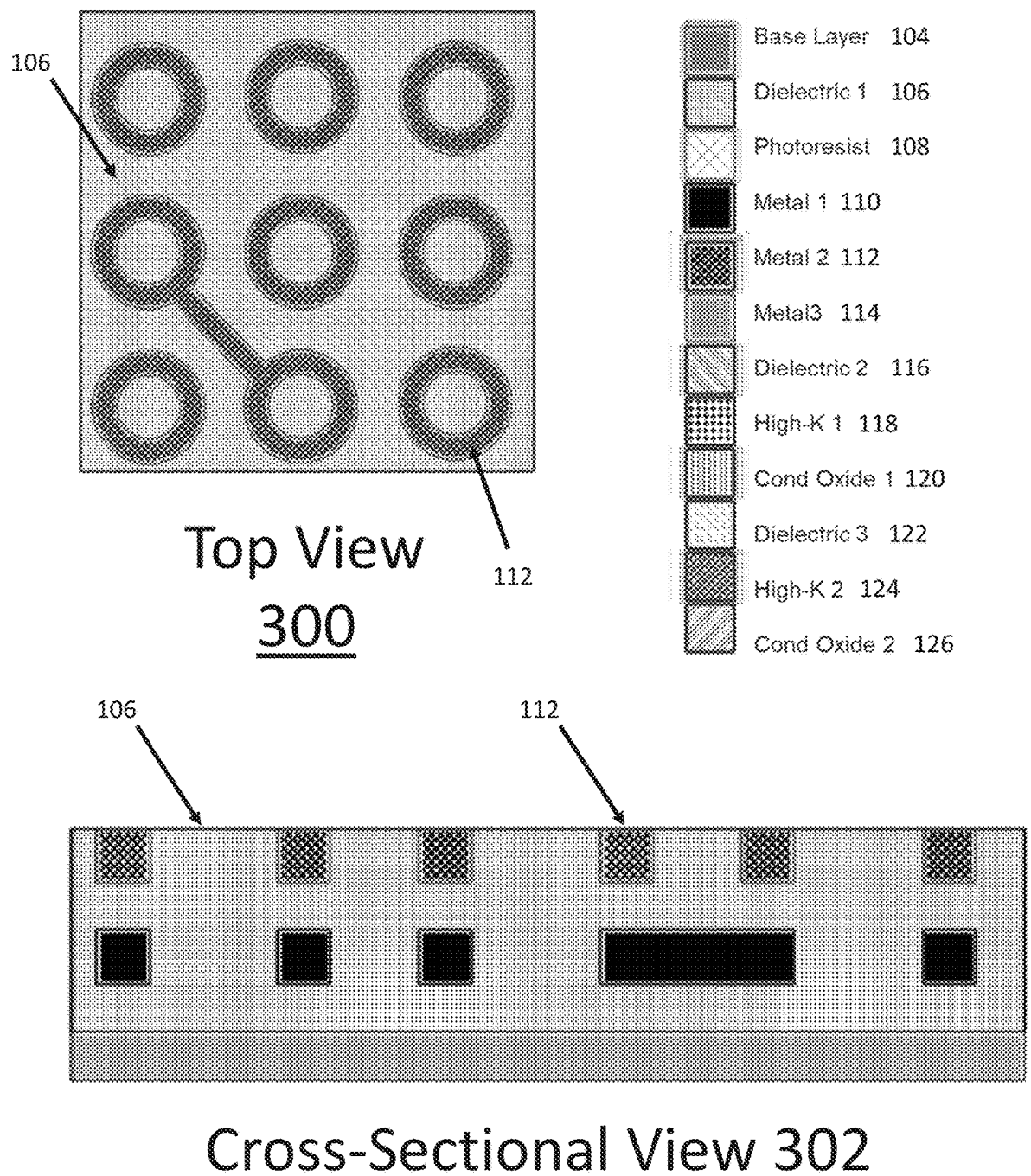

FIG. 3 illustrates a top view 300 and a cross-sectional view 302 of the next stage in the example process flow, in which another second layer of dielectric 106 (sometimes referred to herein as a "second dielectric layer") is deposited on top of the first layer of dielectric 106 and the first layer of metal 110. Similar processes to those described above in connection with FIG. 1 are then applied to the second layer of dielectric 106 to etch a portion that can be deposit filled with a layer of metal 112 (shown as "Metal 2" in the legend). To so do, a second metal mask of the photoresist 108 patterned onto the surface of the second layer of dielectric 106, which is used to pattern and directionally etch the second layer of dielectric 106, similarly to the process used to etch the first layer of dielectric 106 as described in connection with FIG. 1. As shown in the cross-sectional view 302, the second layer of dielectric 106 is etched partially, such that a portion of second layer of dielectric 106 covers the entirety of the first layer of dielectric 106 and first layer of metal 110. The top view 104 shows how the mask for the layer of metal 112 is formed to make connections with other ring structures. Although connections between only two rings of the metal 112 are shown, it should be understood that any number of connections can be defined in the layer of the metal 112 using any variety of masking techniques to create various logical or electrical circuits. It should also be understood that each metal contact may have one or more traces extending out (not shown) to provide a landing pad for a contact via to be added at the end of the process. Such a trace may appear similar to the trace portion extending from the center circle in the top view of 1400. Moreover, each metal layer may have such a trace extending in a different direction so as not to overlap and thereby allow a conductive via to connect to the metal contact. The metal 112 can be any metal that is suitable for a gate electrode of a transistor device. In some implementations, the metal 112 can be a different material from the metal 110. After patterning the second layer of dielectric 106, the layer of the metal 112 may be deposit-filled using a suitable deposition technique. The surface may then be polished using a CMP process.

Figure 4:
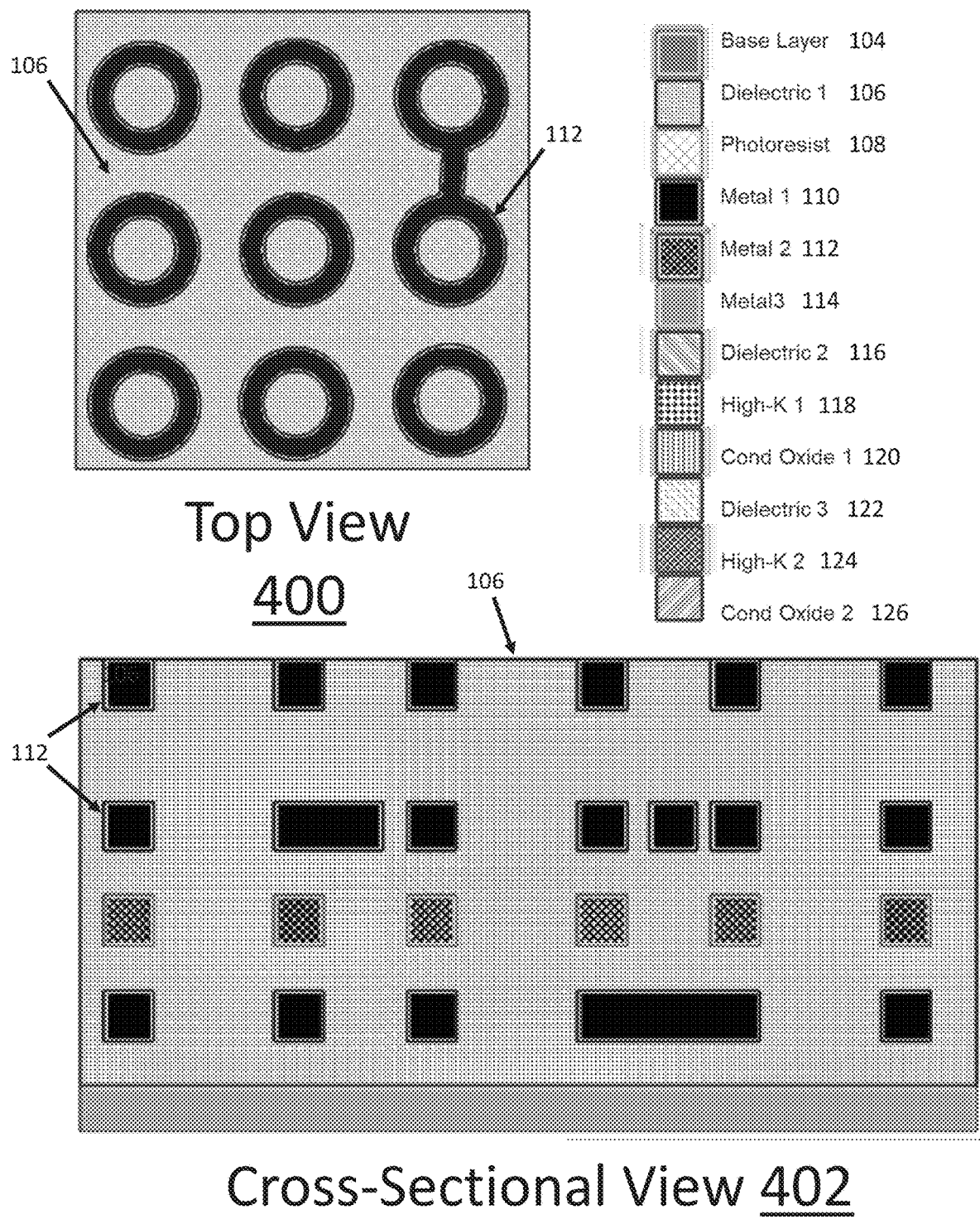

Referring to the next stage of the process flow shown FIG. 4, illustrated is a top view 400 and a cross-sectional view 402 in which additional layers of the dielectric 106 and the metal 110 are deposited using processes similar to those described above in connection with FIGS. 1 and 2. Similar to the techniques described above, a third mask for another layer of the metal 110 (which may be used to define a source or a drain of a transistor structure) is provided following the deposition of an additional layer of the dielectric 106 over the layer of the metal 112. The third layer of the metal 110 can then be deposit-filled and chemical-mechanical polished. The first layer of the metal 110, the layer of the metal 112, and the second layer of the metal 110 can respectively define the source, gate, and drain (or the drain, gate, and source) of a transistor structure. As shown in the cross-sectional view 402, another layer of dielectric 106 may be deposited following the CMP process of the second layer of the metal 110, and a fourth metal mask may be applied (e.g., using the photoresist 108) to define the pattern for a third layer of the metal 110. As shown in both the top view 400 and the cross-sectional view 402, the third layer of the metal is then deposit-filled and chemical-mechanical polished to create another source or drain electrode for a second transistor structure.

Note that the processes described herein are shown as ring structures, each having a center portion that is aligned across each of the first layer of metal 110, the layer of the metal 112, the second layer of the metal 110, and the third layer of the metal 110. In layer process steps, a central channel (sometimes referred to as a "channel opening" or a "body opening") will be etched to define a central transistor structure in the center of each ring structure. Therefore, each of the photoresist 108 masks used to pattern the layers of the metal 110 and metal 112 may be aligned, as shown in the top views 100, 200, 300, and 400, and in the cross-sectional views 102, 202, 302, and 402, of FIGS. 1-4, respectively.

Figure 5:
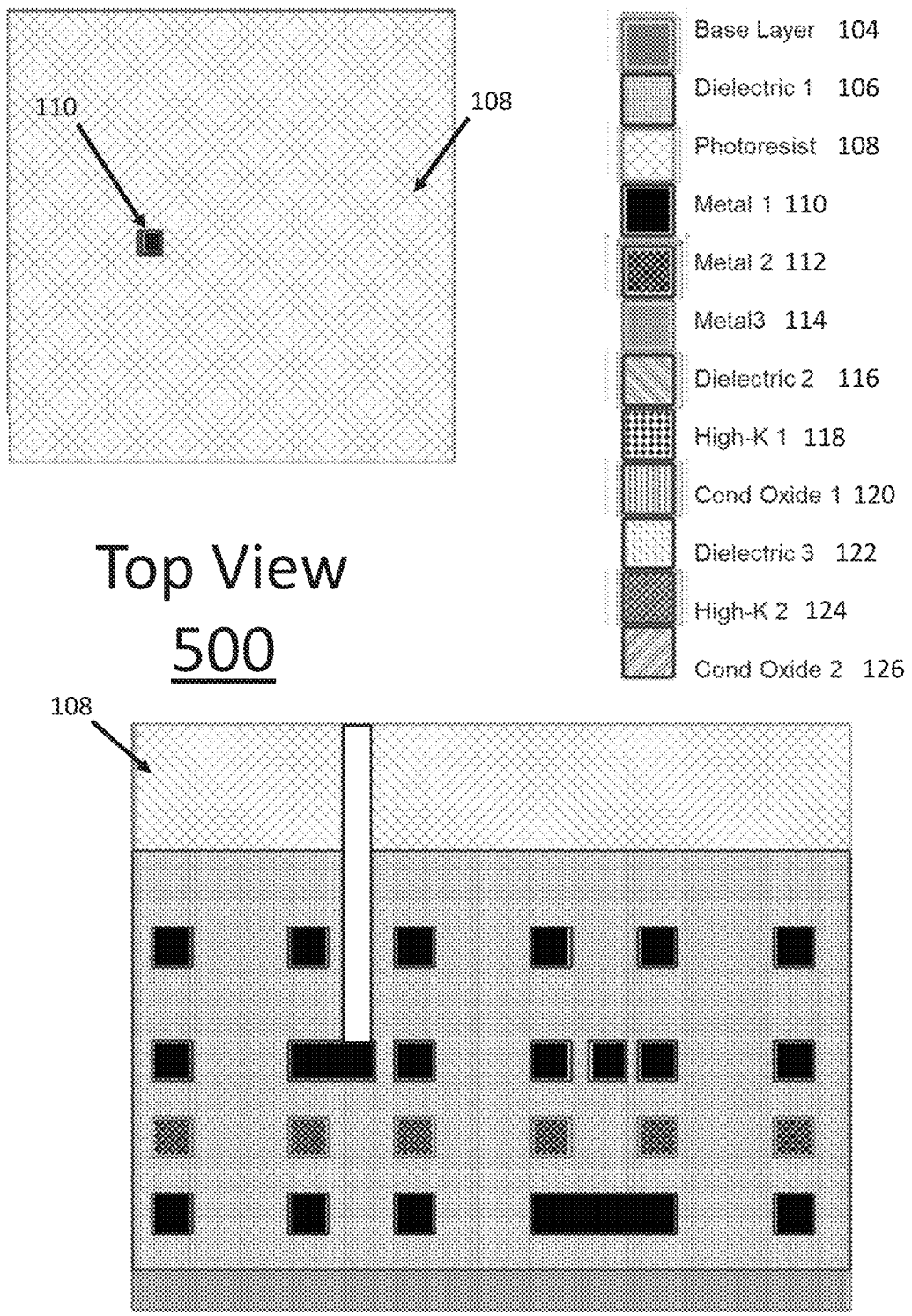

Referring the next stage in the process flow in FIG. 5, illustrated is a top view 500 and a cross-sectional view 502, in which another layer of dielectric 106 is deposited. At this stage in the example process flow, a via can be formed such that an electric connection may be made between an existing metal layer (here, the second layer of the metal 110), and the next layer of metal (which in this process flow will form a gate of a second transistor structure). To create this electrical connection, a dual damascene mask (e.g., of the photoresist 108) may be fabricated and patterned over the layer of the dielectric 106. The dielectric 106 is then be directionally etched with an etch stop on metal (here, the second layer of the metal 110), to open path to connect the second layer of the metal 110 and to the next layer of metal that will be deposited in to following step. Although this type of electric connection is shown at this stage in the process flow, it should be understood that vias or electrical connections can be created at any stage to create desired electric or logical circuits. Such connections can be performed prior to the deposition of a metal layer, such that the deposit-filled metal fills the etched pathway between layers and electrically connects desired layers.

Figure 6:
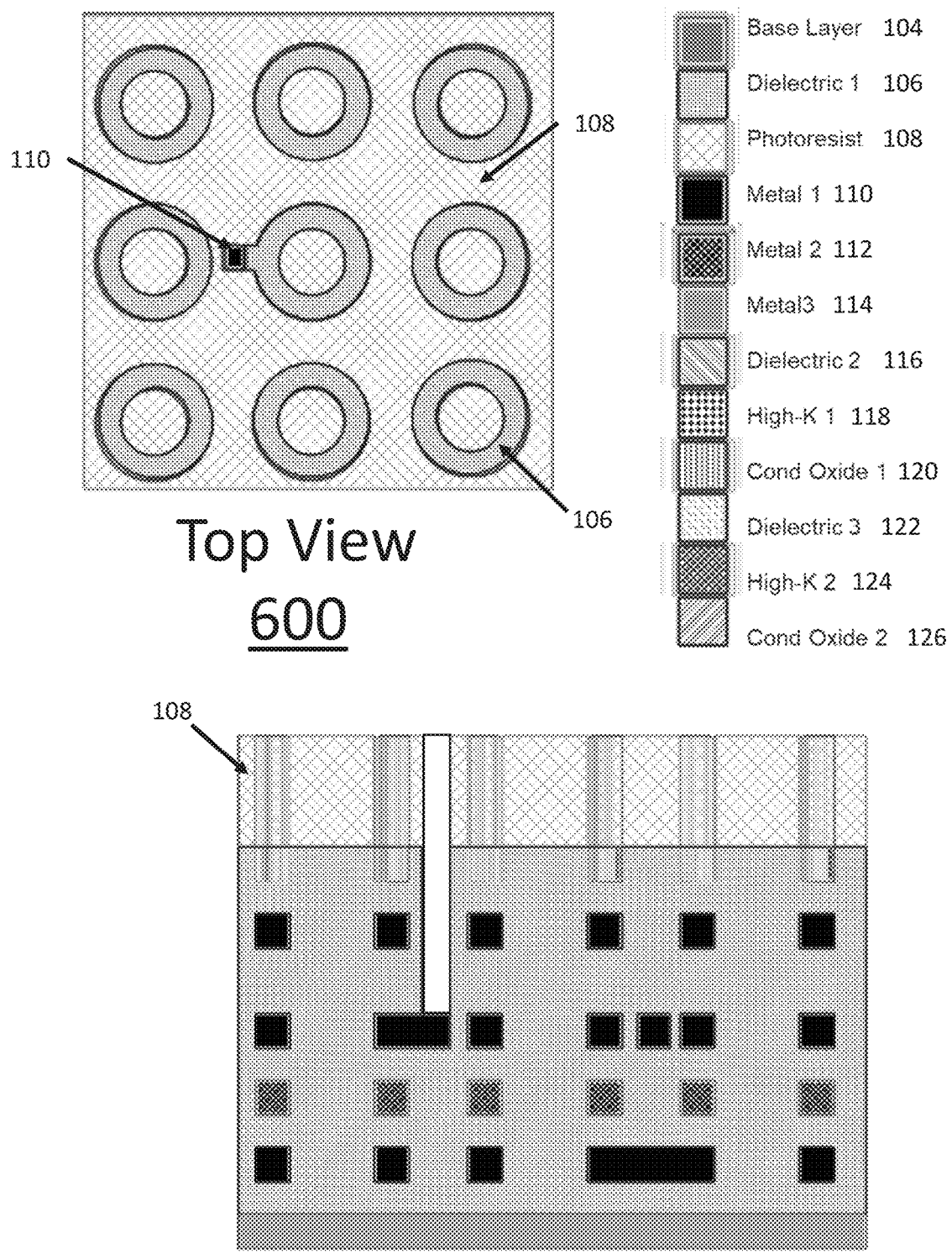

Referring to the next stage of the process flow in FIG. 6, illustrated is a top view 600 and a cross-sectional view 602 in which a layer of photoresist 108 used to create the via is stripped and patterned with a fifth metal mask. Similar to the other metal masks, the fifth metal mask has a ring shape that is aligned with the previously deposited metal layers. The dielectric 106 may be etched partially, similar to the partial etch shown in FIG. 1. As shown in the top view 600, the patterning of the photoresist 108 connects the opening formed in the previous step (shown in FIG. 5), thereby enabling a connection between the metal layer that will deposit fill the etched layer of the dielectric 106 and the previously deposited layer of the metal 110. As above, the partial etching process can be performed using any type of etching process suitable for etching the dielectric 106.

Figure 7:
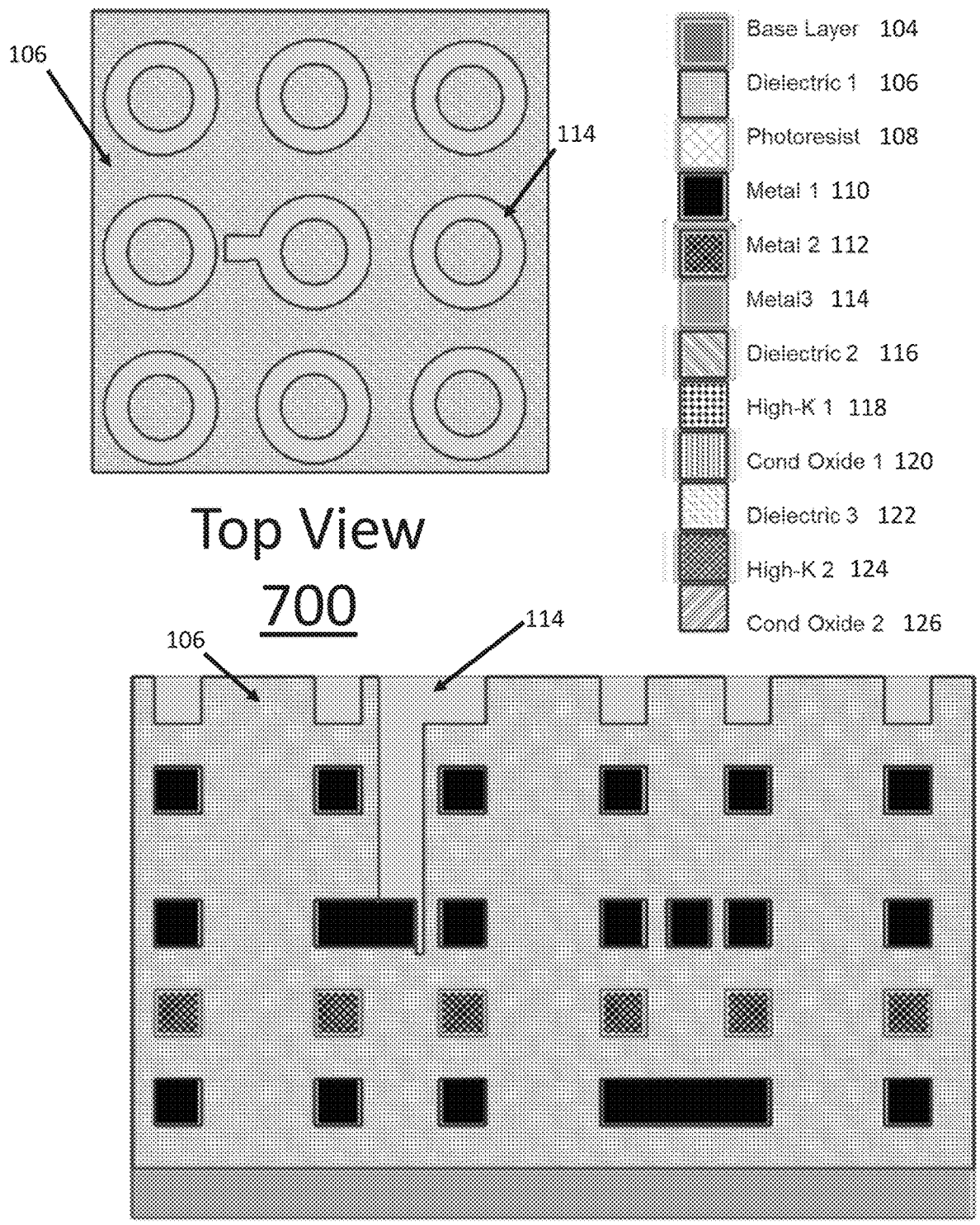

Referring to the next stage in the process FIG. 7, illustrated is a top view 700 and a cross-sectional view 702, in which a layer of the metal 114 (shown as "Metal 3" in the legend) is deposit-filled and chemical-mechanical polished. As shown, in this stage in the process flow, the photoresist layer 108 of FIG. 6 has been stripped using a suitable stripping technique and the layer of metal 114 is deposit-filled into the previously etched portions of the dielectric 106, as shown in the cross-sectional view 702. The metal 114 can be provided as gate metal for a second transistor structure, which is positioned in the stack above the first transistor structure. In some implementations, the metal 114 can be different from the metal 110 and the metal 112. For example, in later process flow steps, the high-k gate material may be selectively deposited on a particular type of metal 114. Therefore, if different high-k gate materials are desired for different layers (e.g., different type transistor on different layers), then the material used for the metal 114 can be selected to be different from the metal 110 and the metal 112, so the desired high-k gate material only grows on the metal 114 and not the metal 110 or the metal 112. In contrast, if identical transistor structures are desired between layers, then the metal 112 and the metal 114 may be selected to be the same material (but a different from that of the metal 110). As shown in the cross-sectional view 702, once the metal 114 is deposit-filled, a connection is formed between the gate layer formed by the metal 110 and the source or drain layer formed by the second layer of the metal 110. As in other metal deposition steps, the device can be subjected to a CMP process following the deposition of the metal 114.

Figure 8:
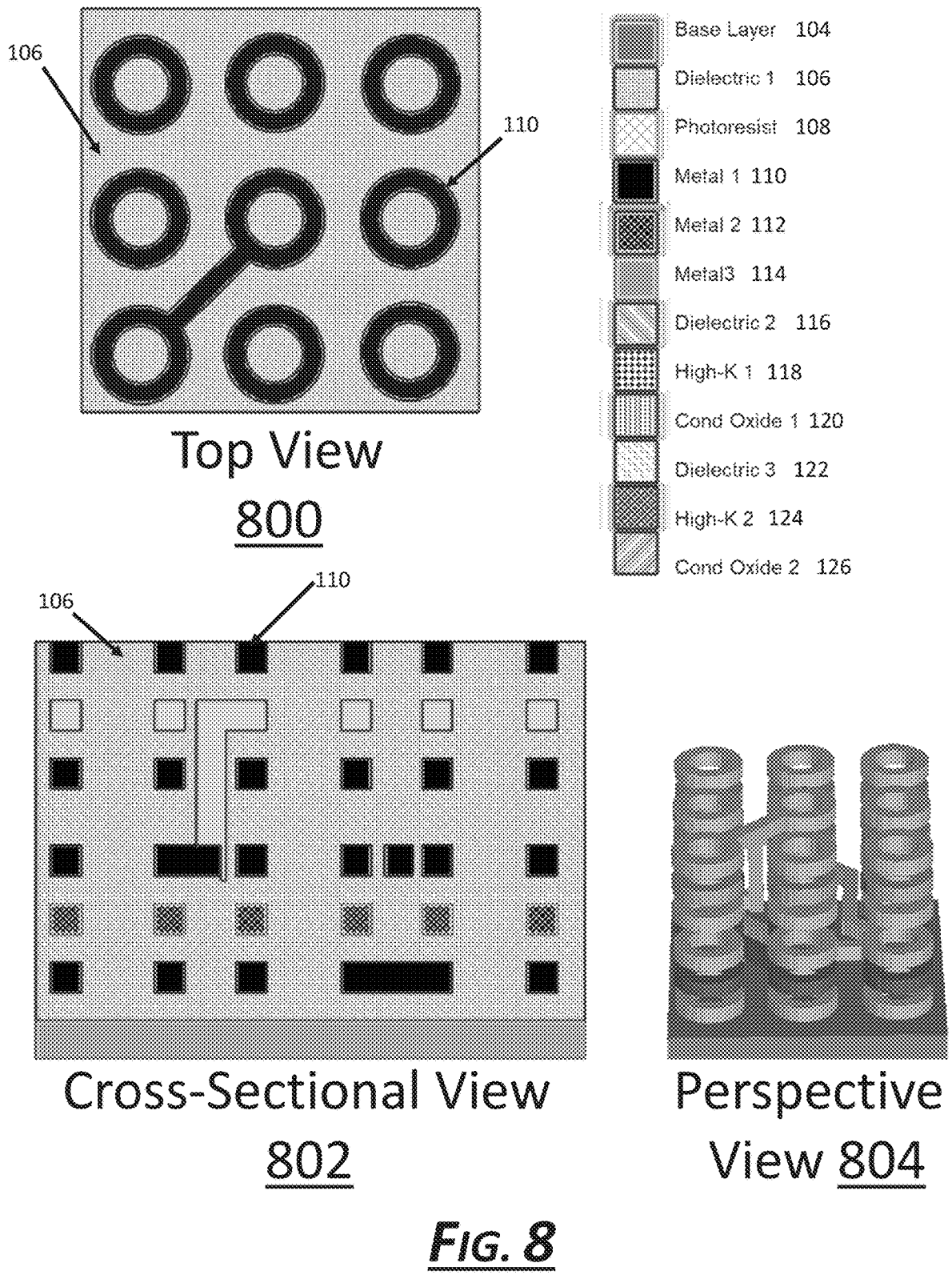

Referring to the next stage of the process flow shown in FIG. 8, illustrated is a top view 800, a cross-sectional view 802, and a perspective view 804, which shows another layer of the dielectric 106 may be deposited. In the illustration of perspective view 804, the dielectric 106 is not shown. This stage is similar to that described above in connection with FIG. 4, except that only a single layer of metal is deposit-filled based on a sixth metal mask may be fabricated (e.g., using the photoresist 108). As above, the layer of the dielectric 106 deposited on the layer of metal 114 may be partially etched based on the pattern of the sixth metal mask. Similar to the other metal layers, the sixth mask defines a similar ring structure that is aligned with the other ring structures of the other layers of the metals 110, 112, and 114. The fourth layer of the metal 110 is then deposit filled into the partially etched portions of the dielectric 106, and subsequently subjected to a CMP process. The fourth layer of the metal 110 can be defined as the source or drain of a second transistor structure positioned on top of the first transistor structure, which is defined in prior processing steps. Collectively, the third layer of the metal 110, the layer of the metal 114, and the fourth layer of the metal 110 can respectively form the source, the gate, and the drain (or respectively the drain, the gate, and the source) of the second transistor structure.

Figure 9:
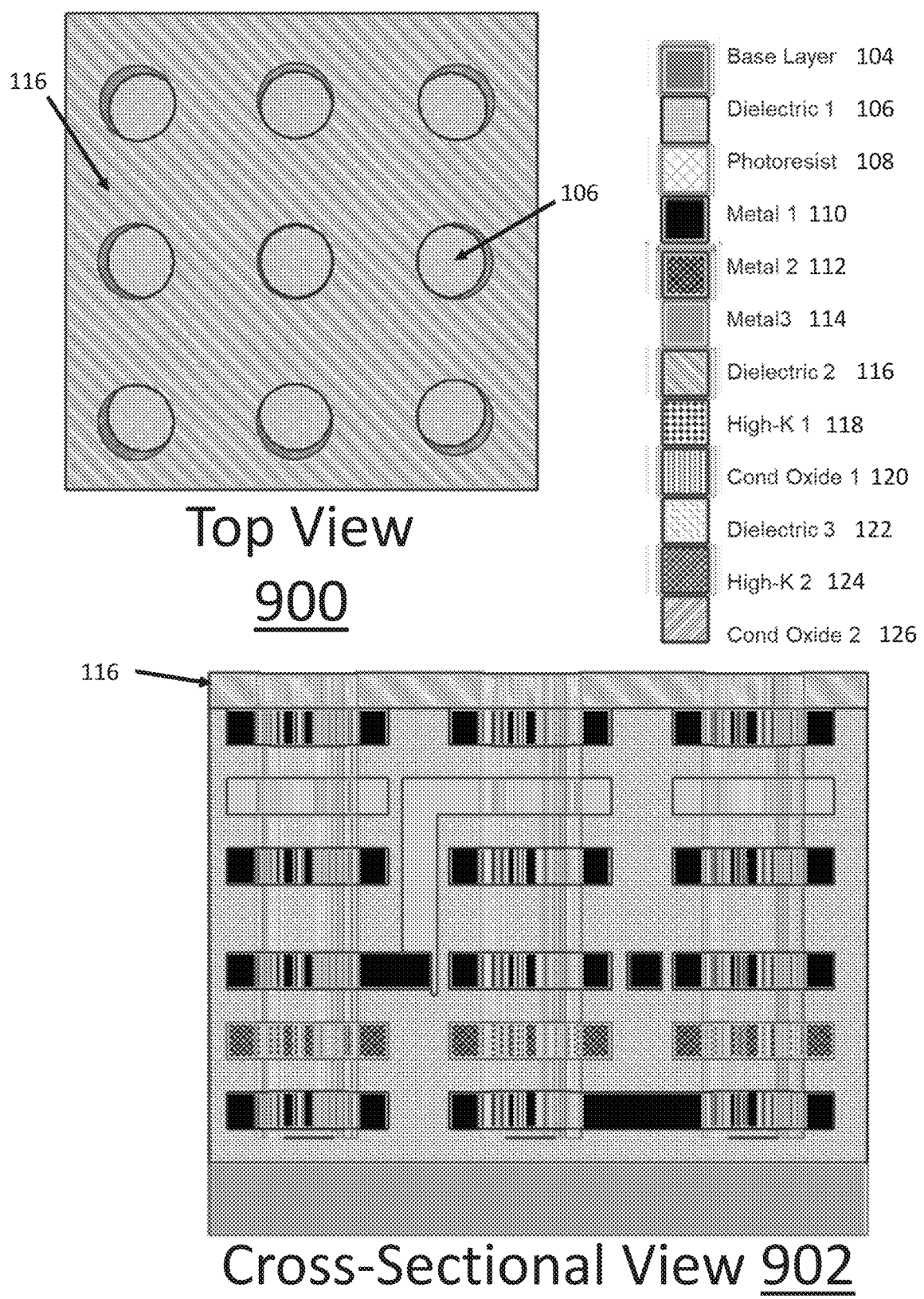

At the next stage of the process flow in FIG. 9, illustrated is a top view 900 and a cross-sectional view 902, which depicts the deposition of a cap layer of a dielectric 116 (shown as "Dielectric 2" in the legend). The dielectric 116 can be deposited using any suitable deposition technique. The dielectric 116 may be a different material than the dielectric 106. The dielectric 116 may be deposited to protect the layers of the dielectric 106 underneath from an etching process. A device trench mask (e.g., made of the photoresist 108) may be used to etch all layers close to base layer 104 to form a body opening (or central channel). As shown in the top view 900, the central channel is defined through each of the central rings of each of the layers of the metal 110, 112, and 114. Because the central portions of each layer are made of the dielectric 106, the etching process can be a controlled directional etching process that etches the dielectric 106 until close to the base layer 104. In some implementations, the etching process may reach the base layer 104. In some implementations, the mask may be larger than the self-aligned space to ensure it etches all layers of dielectric 106 and portions of the layers of metal 110, 112, and 114 to maintain a uniform device diameter, and to account for any misalignment between metal layers that is created during this process flow.

As shown in the top view 900, nine central channels are defined that each corresponds to a respective stack of transistors. It should be understood that nine stacks are shown purely for example purposes, and that any number of devices or stacks may be defined. For example, in some limitations, only a single layer of transistor devices may be defined (e.g., only a first layer of metal 110, a layer of the metal 112 or 114, and a layer of metal 110 to define the source, gate, and drain). Likewise, it should be understood that further layers of transistor or other electric or electronic devices may be defined by additional layers, until stacks of N devices are created. Stacks of two transistor devices (e.g., N=2) are shown here for illustrative simplicity, but this should not be considered limiting to the scope of the disclosure. As shown in the cross-sectional view 902, each layer of metal 110, 112, and 114 are exposed to the central channel, such that gate oxides can be selectively deposited onto the metals 112 or 114 in subsequent processing steps. Likewise, conductive channels can be defined by depositing conductive oxides in the central channels, as described in greater detail herein.

Figure 10:
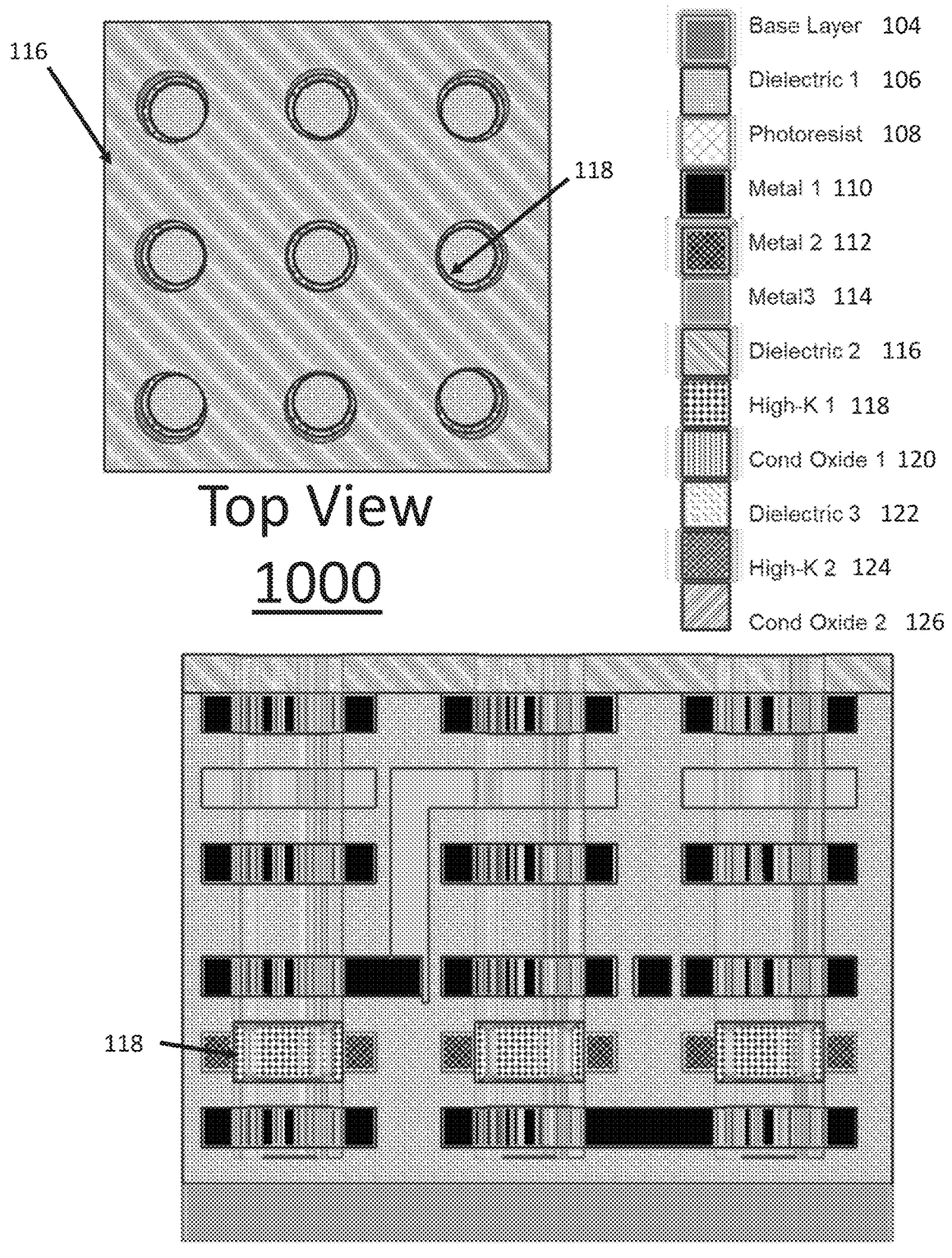

Referring to the next stage of the process flow in FIG. 10, illustrated is a top view 1000 and a cross-sectional view 1002 of the stack shown in FIG. 9 following a selective deposition process of a high-K dielectric 118 (shown as "High-K 1" in legend) onto on the layer of metal 112. The high-K dielectric 118 can be any type of gate dielectric material, such as a high-k dielectric material. Some examples of high-k dielectric materials can include, but are not limited to, $Si_3N_4$, $Al_2O_3$, $Ta_2O_5$, $TiO_2$, $ZrO_2$, and $HfO_2$. A selective deposition process that involves specifically co-designed chemicals and materials enables precise deposition of a target material, here the high-K dielectric 118. In some implementations, the selective deposition process can involve growing the high-K dielectric 118 material onto the exposed portions of the metal 112 to form the gate dielectric. The selective deposition process can ensure that the high-K dielectric 118 material is deposited only onto the exposed portions of the metal 112, thereby insulating the metal 112 from the central channel (and any conductive oxides deposited in later process steps). The selective deposition process can deposit the high-K dielectric 118 until a predetermined desired thickness is reached (e.g., such that the transistors exhibit desired electrical characteristics). The high-K dielectric 118 acts as an effective gate dielectric for the first layer of transistor devices.

Figure 11:
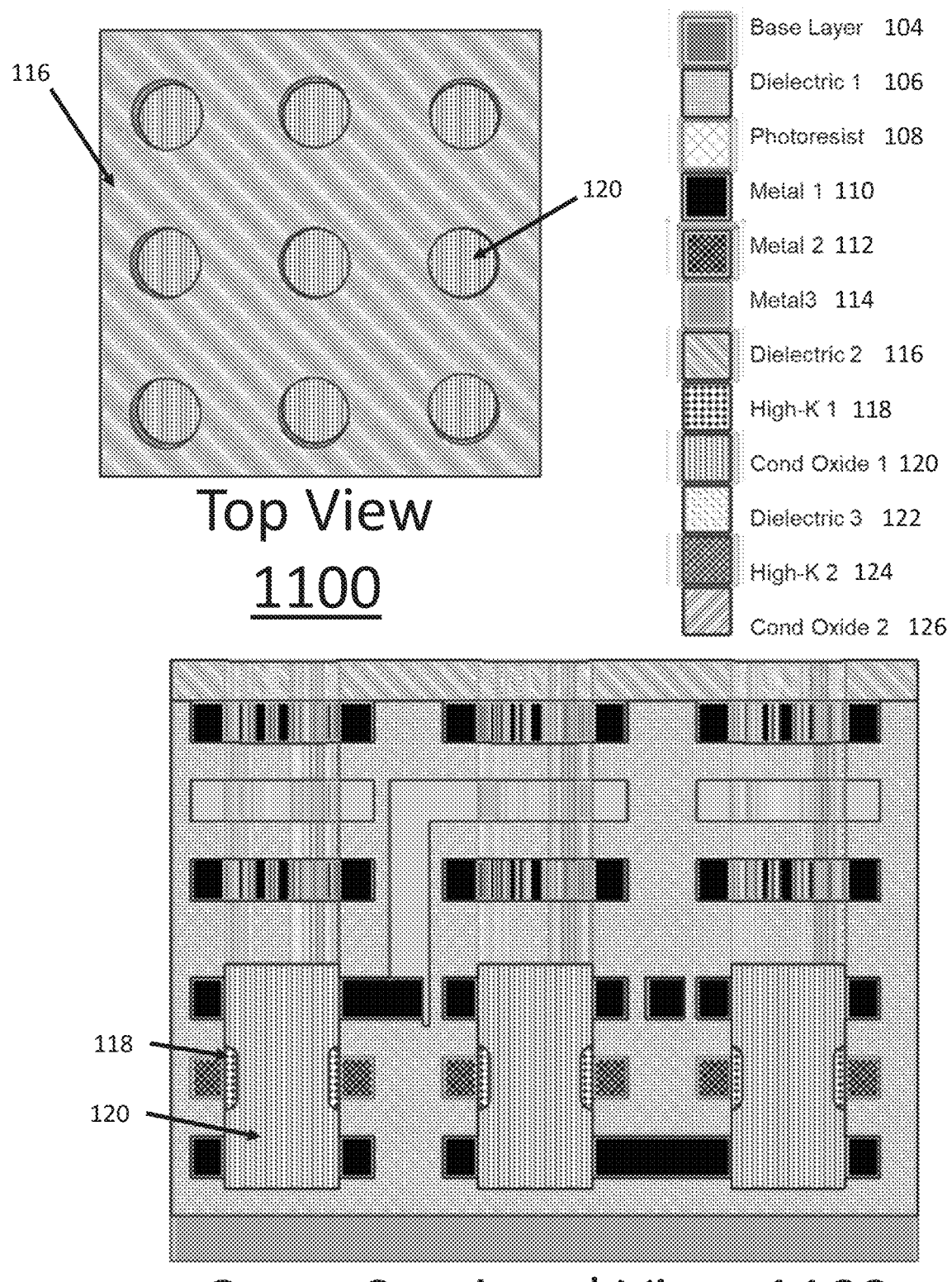

Referring to the next stage in the process flow shown in FIG. 11, illustrated is a top view 1100 and a cross-sectional view 1102, in which a central channel material may be formed (e.g., grown, applied, deposited) in the body opening. As shown in the top view 1100 and the cross-sectional view 1102, the central channel can be deposit filled with a layer, such as a conductive oxide 120 (shown as "Cond Oxide 1" in the legend). A CMP process can then be performed following the deposition of the conductive oxide 120. The conductive oxide 120 can be any type of conductive oxide material with semiconductive properties. For example, the conductive oxide 120 may be an N-type (e.g., N+) conductive oxide, such as $In_2O_3$, $SnO_2$, InGaZnO, and ZnO, among others. Alternatively, the conductive oxide 120 may be a P-type conductive oxide, such as SnO. Following the deposition of the conductive oxide 120, the conductive oxide 120 is then selectively etched to a predetermined height (e.g., slightly above the second metal layer 110) to define a first set of transistor devices. As shown in the cross-sectional view 1102, the first layer of the metal 110 and the second layer of the metal 110 each form a source or drain for the transistor, while the metal 112 forms the gate electrode for the transistor, and the high-K dielectric forms the gate dielectric of the transistor. Various parameters (e.g., thickness or shape of one or more layers of the metal 110, thickness or shape of one or more layers of the metal 112, thickness or shape of one or more layers of the metal 114, thickness or shape of the high-K dielectric 110, thickness or shape of the layers of dielectric 106, the diameter of the central channel, etc.) may be selected prior to the fabrication process to create transistors with desired properties. It should also be appreciated, that other materials may be used for the central channel, such as a 2D material or epitaxial material. In the case of an epitaxial layer, the channel etch will reach completely to the base layer 104, which in such an embodiment would be a semiconductor such as silicon. Then, a first layer of material, e.g., SiGe, would be formed followed by the growth of the channel. The SiGe material would subsequently be removed and/or replaced by an isolation material (not shown).

Figure 12:
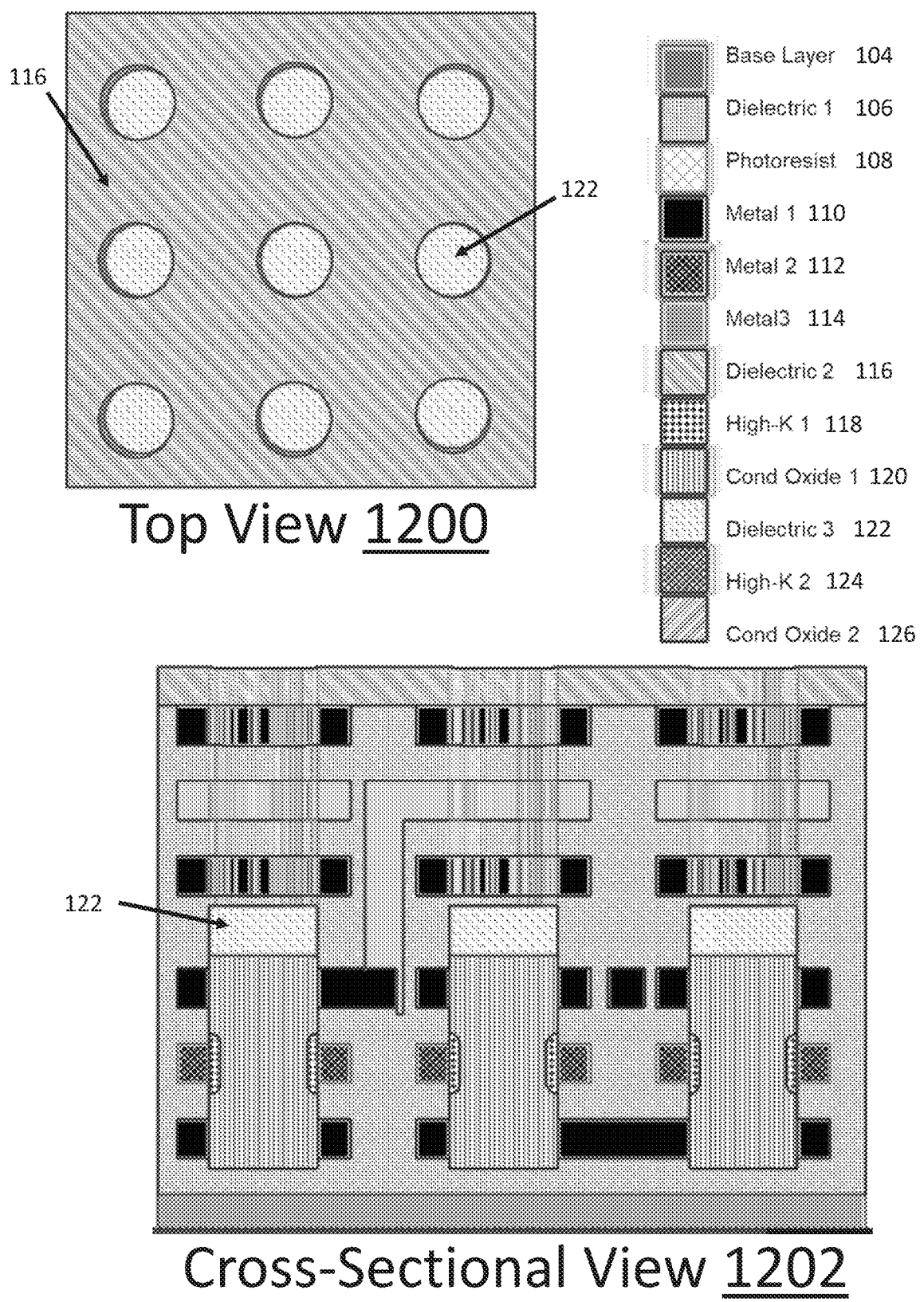

Referring to FIG. 12, illustrated is a top view 1200 and a cross-sectional view 1202 of the next stage of the process flow, in which the central channel is deposit filled with a layer of dielectric 122 (shown as "Dielectric 3" in the legend), and then subjected to a CMP process. The dielectric 122 may be a different material than the dielectric 106 and the dielectric 116. After each of the central channels is deposit-filled with the dielectric 122, the dielectric 122 is selectively etched below the third layer of metal 110. For example, the device may be masked with a photoresist 108 and directionally etched such that the third layer of metal 110 is exposed to the central channel. In some implementations, the dielectric 122 may be selectively etched using a chemical or material that has limited reactivity with respect to other materials in the stack. The layer of dielectric 122 is an isolation layer between each transistor structures and may be positioned between two different conductive oxides following further processing steps.

Figure 13:
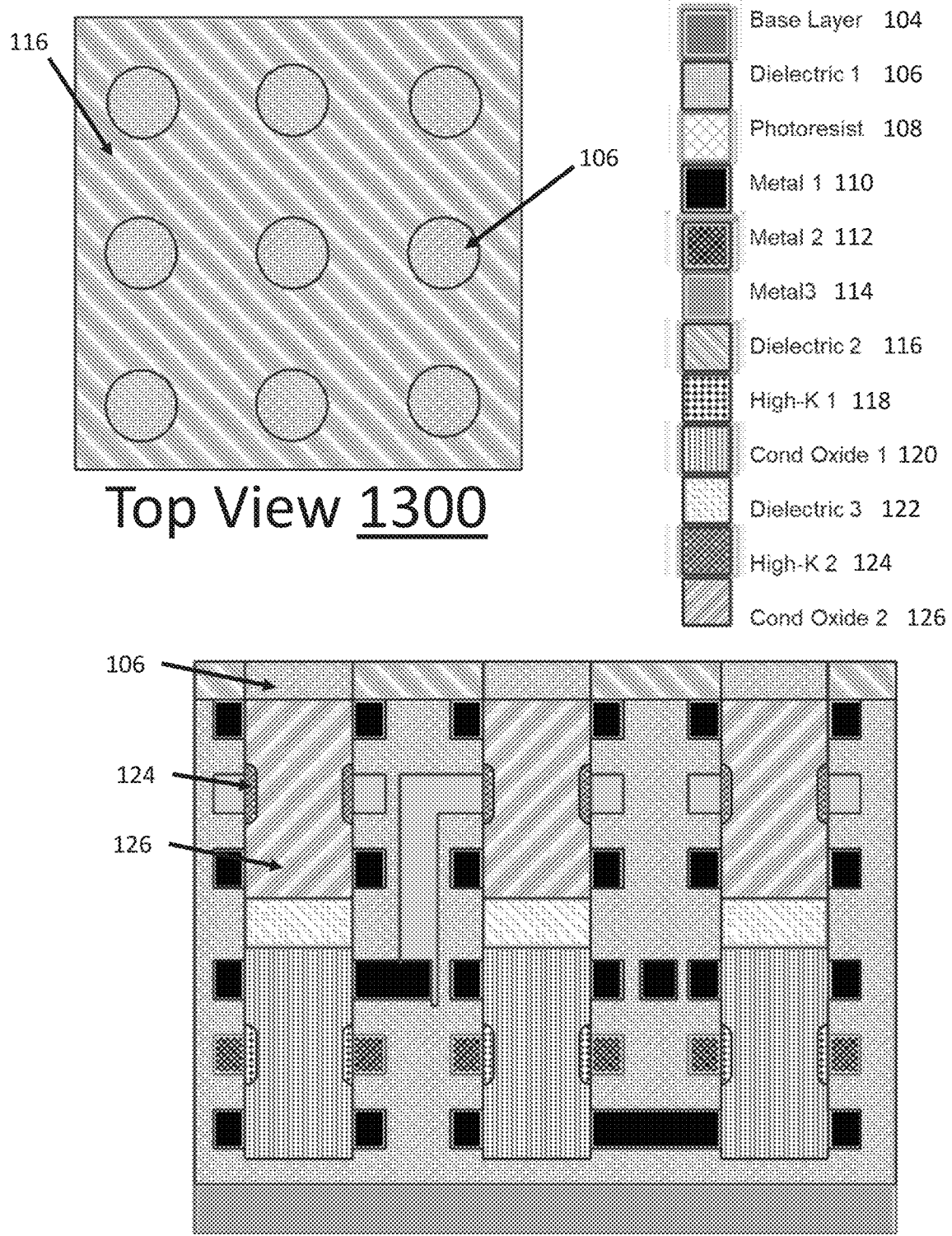

Referring to FIG. 13, illustrated is a top view 1300 and a cross-sectional view 1302 of the final stages in the process flow. First, a second high-K dielectric 124 (shown as "High-K 2" in the legend) may be selectively deposited onto the metal 114, using a process similar to that described in connection with FIG. 10. The second high-K dielectric 124 can be any type of gate dielectric material, such as a high-k dielectric material. In some implementations, the high-K dielectric 124 may be a different material than the high-K dielectric 118. In some implementations, the selective deposition process can involve growing the high-K dielectric 124 material onto the exposed portions of the metal 114 to form the gate dielectric for the second set of transistor structures. The selective deposition process can ensure that the high-K dielectric 124 material is deposited only onto the exposed portions of the metal 114, thereby insulating the metal 114 from the central channel (and any conductive oxides deposited in later process steps). The selective deposition process can deposit the high-K dielectric 124 until a predetermined desired thickness is reached (e.g., such that the transistors exhibit desired electrical characteristics). In some implementations, the thickness of the high-K dielectric may be selected to be different than that of the high-K dielectric 118. The high-K dielectric 124 acts as an effective gate dielectric for the second layer of transistor devices.

After the second high-K dielectric 124 is selectively deposited onto the metal 114, the central channel can be deposit filled with a second conductive oxide 126 (shown as "Cond Oxide 2" in the legend) to form a second transistor structure. The second conductive oxide 126 may be different from the conductive oxide 120. For example, if the conductive oxide 120 is an N-type conductive oxide, the second conductive oxide 126 may be a P-type conductive oxide. After the central channel is deposit filled with the second conductive oxide 126, the conductive oxide 2 may be etched to be flush with, or to extend slightly above, the fourth layer of the metal 110. Any remaining space between the top of the second conductive oxide 126 and the surface of the stack can then be filled with the dielectric 106 to protect the conductive oxide 126 at the top surface. Although FIGS. 11 and 13 illustrate different conductive oxides, the same conductive oxide may be used in other embodiments. In such configurations, the same high-K dielectric may also be used, and the same metals may be used. The final construction of the 3D vertical transistors is shown in the cross-sectional view 1302.

Referring now to FIGS. 14-16, illustrated is a second flow process, similar to that depicted in FIGS. 1-13, in which vertical transistors are fabricated using a self-aligning process. In contrast to the process flow described in connection with FIGS. 1-13, the process flow shown in FIGS. 14-16 is performed without first defining the central channel with a first dielectric, and subsequently directionally etching that dielectric to open the central channel. Instead, the process flow shown in FIG. 14 defines each metal layer to be solid, and subsequently performs a non-selective, controlled directional etching process that etches through some or all of the metal layers and some or all of the dielectric layers until a predetermined depth is reached. These and other aspects are described herein. Referring to FIG. 14, illustrated is a top view 1400, a cross-sectional view 1402, and perspective view 1404 of a stack of materials is fabricated using processes similar to those described herein above in connection with FIGS. 1-8, but utilizing metal masks that do not define the central channel. In the illustration of perspective view 1404, the dielectric 106 is not shown.

Referring briefly to FIG. 8, as shown in the top view 800, the metal masks used to define the metal layers result in a ring shape, where the central channel is defined using layers of the dielectric 106. One potential drawback of the process shown in FIGS. 1-8 is the central channel must be aligned across each of the metal layers, which utilizes very precise positioning of each metal mask. However, this may become impractical as transistor size decreases. Referring back to FIG. 14, to overcome these deficiencies, the metal layers (e.g., the first, second, third, and fourth layers of metal 110, the layer of metal 112, and the layer of metal 114), can each be masked without defining the central channel. This is shown in the top-view 1400, which shows the fourth layer of the metal 110 as a circle shape, rather than a ring shape as in FIG. 8.

Referring to FIG. 15, illustrated is a top view 1500 and a cross-sectional view 1502 of a material stack following an etching process that defines a central channel. The etching process can be similar to FIG. 9. For example, a protective layer of a dielectric 116 may first be deposited over the top layer of the metal 110 and the dielectric 106. The layer of the dielectric 116 may be deposited using a mask, such that central channel openings are defined to be substantially centered over each of the metal layers in the stack. A directional etching process can then be applied, which etches each of the layers in the stack to form central channels that each correspond to a stack of transistor structures. The directional etching process can be similar to the process described in connection with FIG. 9, except that the etching process used in this flow process must be capable of etching the dielectric 106, the metal 110, the metal 112, and the metal 114. The etching process can be performed to etch the layers close to a predetermined depth (e.g., close to the base layer 104), forming the body opening for each stack of transistor structures.

Figure 16A:
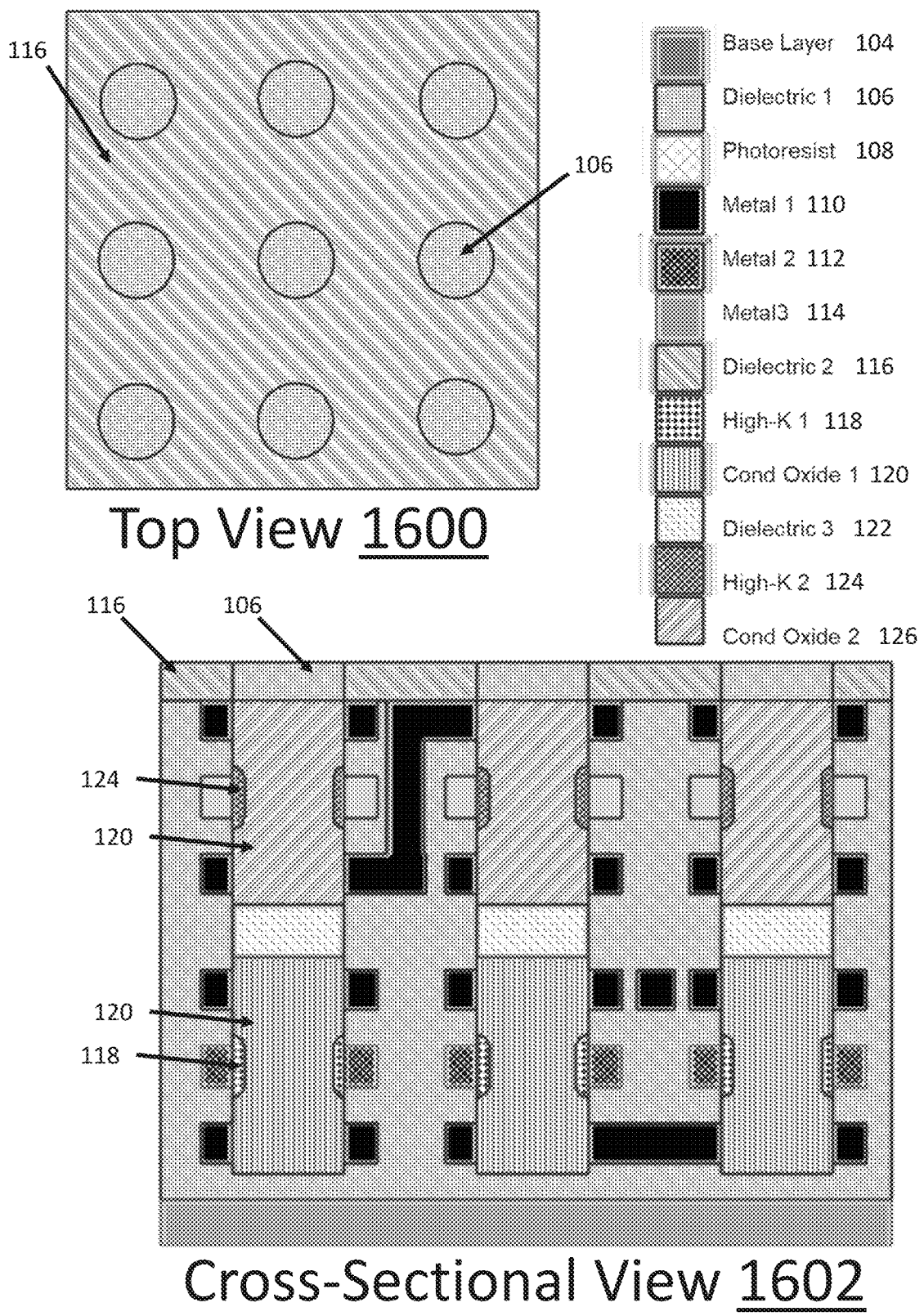

FIGS. 16A and 16B show a completed device including nine transistor stacks following a process flow similar to that described in connection with FIGS. 10-13. In the illustrations of top view 1604, side view 1606, and perspective view 1608, the dielectric 106 is not shown. As described above, high-K dielectrics (e.g., the high-K dielectric 118 and the second high-K dielectric 124) can be selectively deposited to bind to the layers of metal 112 and 114, respectively. Likewise, the body opening can be filled with a conductive oxide (e.g., the conductive oxide 120 and the second conductive oxide 126), and a dielectric (e.g., the dielectric 122 and the dielectric 106, respectively) may be deposited on top of each conductive oxide, as described above in connection with FIGS. 10-13. Although FIG. 16A shows the high-K gate dielectrics (e.g., the high-K dielectric 118 and the second high-K dielectric 124) being deposited using the process shown in FIGS. 10-13, it should be understood that the self-aligning fabrication process shown in FIGS. 14 and 15 can also be performed in connection with alternative high-K dielectric deposition techniques, such as those described in connection with FIGS. 17-27.

In another implementation, the high-K dielectric materials may be deposited into a recessed gate layer, which provides for greater control over the thickness of the gate dielectric material in each transistor. Referring to FIG. 17, illustrated is a top view 1700 and a cross-sectional view 1702 of a material stack that is fabricated using the techniques described in connection with FIGS. 1-9 or the techniques described in connection with FIGS. 14 and 15. However, instead of the process continuing to FIG. 10 (or FIG. 16, if the self-aligning etching process of FIGS. 14 and 15 is used) as shown above, the layer of metal 112 may be recessed using an etching process to create a recessed region 1704. The etching process may be a selective etching process that etches the metal 112 to create a recessed region 1704 of a predetermined volume, by etching the layer of metal 112 (the gate metal) by a predetermined amount. The recessed region may be deposit filled, or selectively deposited, with high-K dielectric material in later process steps.

After creating the recessed region 1704, the process flow continues in FIG. 18, which illustrates is a top view 1800 and a cross-sectional view 1802 of the selective deposition of a high-K dielectric 118 onto the layer of metal 112. The layer of metal 112 can be selected to be a seed layer, on which the high-K dielectric 118 may be grown to isolate the gate metal 112 from the central channel, thereby creating a transistor structure. The high-K dielectric can be grown such that a predetermined amount of high-K material 118 fills the recessed region 1704 as created in the process step described above in connection with FIG. 17. The high-K dielectric 118 material may be selected to have desired attributes or properties, such as a desired dielectric constant. Likewise, the high-K dielectric 118 may be grown to create a predetermined separation distance between the gate metal 112 and the central channel of the transistor structure.

Referring to the next stage in the process flow in FIG. 19, illustrated are a top view 1900 and a cross-sectional view 1902 a first layer of transistor structures being creating following the deposition of a conductive oxide 120 in the central channel. Similar to the process described in connection with FIG. 11, the body opening may be deposit filled with a desired conductive oxide 120 (which may be N-type or P-type) and then subjected to a CMP process to polish the surface of the device. The conductive oxide 120 is then etched (e.g., either selectively or using a directional etch and a mask) to a predetermined height (e.g., slightly above the second metal layer 110), thereby forming a transistor structure. As shown in the cross-sectional view 1702, the first layer of the metal 110 and the second layer of the metal 110 each form a source or drain for the transistor, while the metal 112 forms the gate electrode for the transistor, and the high-K dielectric forms the gate dielectric of the transistor.

Figure 20:
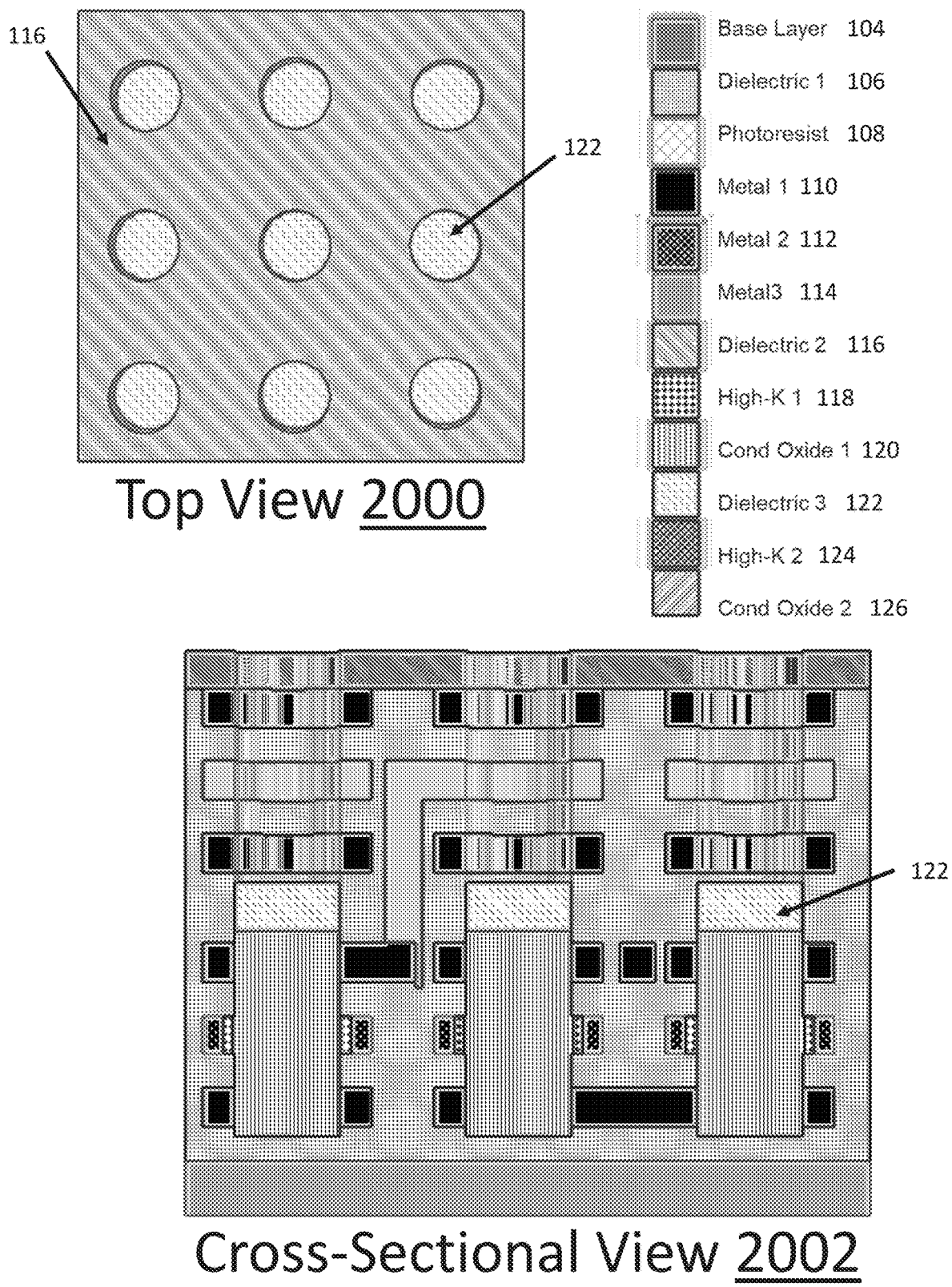

Referring to the next stage in the process flow in FIG. 20, illustrated is a top view 2000 and a cross-sectional view 2002, showing the body opening being deposit filled with a dielectric 122 and then subjected to a CMP process. This process may be similar to the process described in connection with FIG. 12. The dielectric 122 may be a different material than the dielectric 106 and the dielectric 116, and is used to electrically isolate each layer of transistor structures. After deposit-filling the central channels with the dielectric 122, the dielectric 122 is etched below the third layer of metal 110. For example, the device may be masked with a photoresist 108 and directionally etched such that the third layer of metal 110 is exposed to the central channel. In some implementations, the dielectric 122 may be selectively etched using a chemical or material that has limited reactivity with respect to other materials in the stack.

Figure 21:
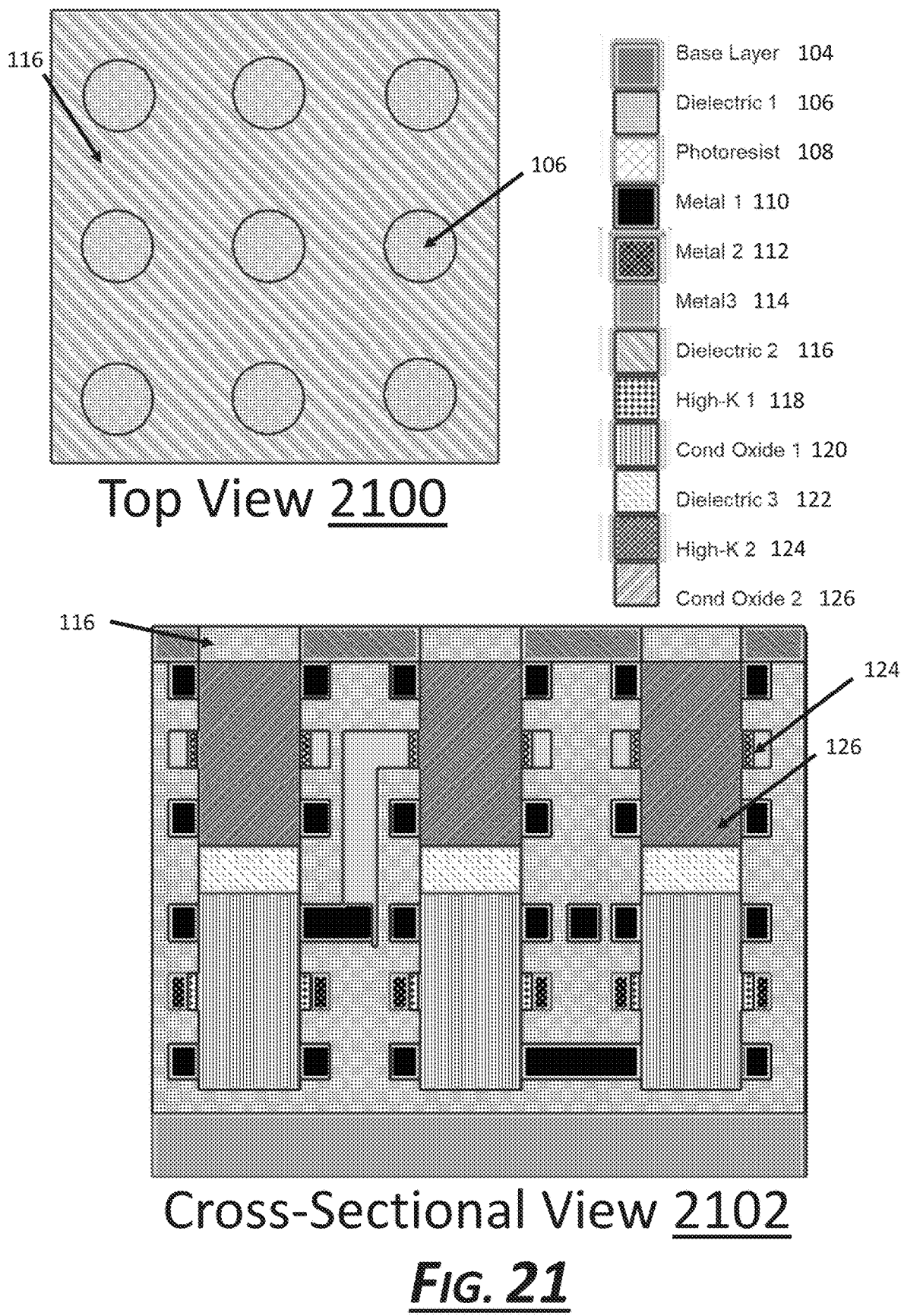

Referring to the next stage of the process flow in FIG. 21, illustrated is a top view 2100 and a cross-sectional view 2102, in which the gate metal 114 is recessed using a selective etching process, and a corresponding second high-K dielectric 124 is selectively deposited. This selective etching process may be similar to the process described above in connection with FIGS. 17 and 18. However, as each layer of transistor structures may have different properties, the properties of the second high-K dielectric 124 may also be different. For example, the metal 112 may be different than the metal 112 and may be recessed by different amounts. Likewise, the second high-K dielectric may be selectively deposited such that the second high-K dielectric has a thickness (e.g., distance between the metal 114 and the central channel) that is different from the thickness of the high-K dielectric 112. Once the second high-K dielectric 114 is selectively deposited to create the gate insulation layer, the body opening is then deposit filled with a second conductive oxide 126, which may be different than the conductive oxide 120. For example, if the conductive oxide 120 is an N-type conductive oxide, the conductive oxide 126 may be a P-type conductive oxide. This process may be similar to the process described above in connection with FIGS. 11 and 19. Once the second conductive oxide 126 is deposited, it may be subjected to a CMP process and then etched to a predetermined height (e.g., to be flush with, or slightly taller than, the fourth layer of the metal 110). Finally, a final layer of dielectric 106 is deposited to protect the second conductive oxide 126.

Figure 22:
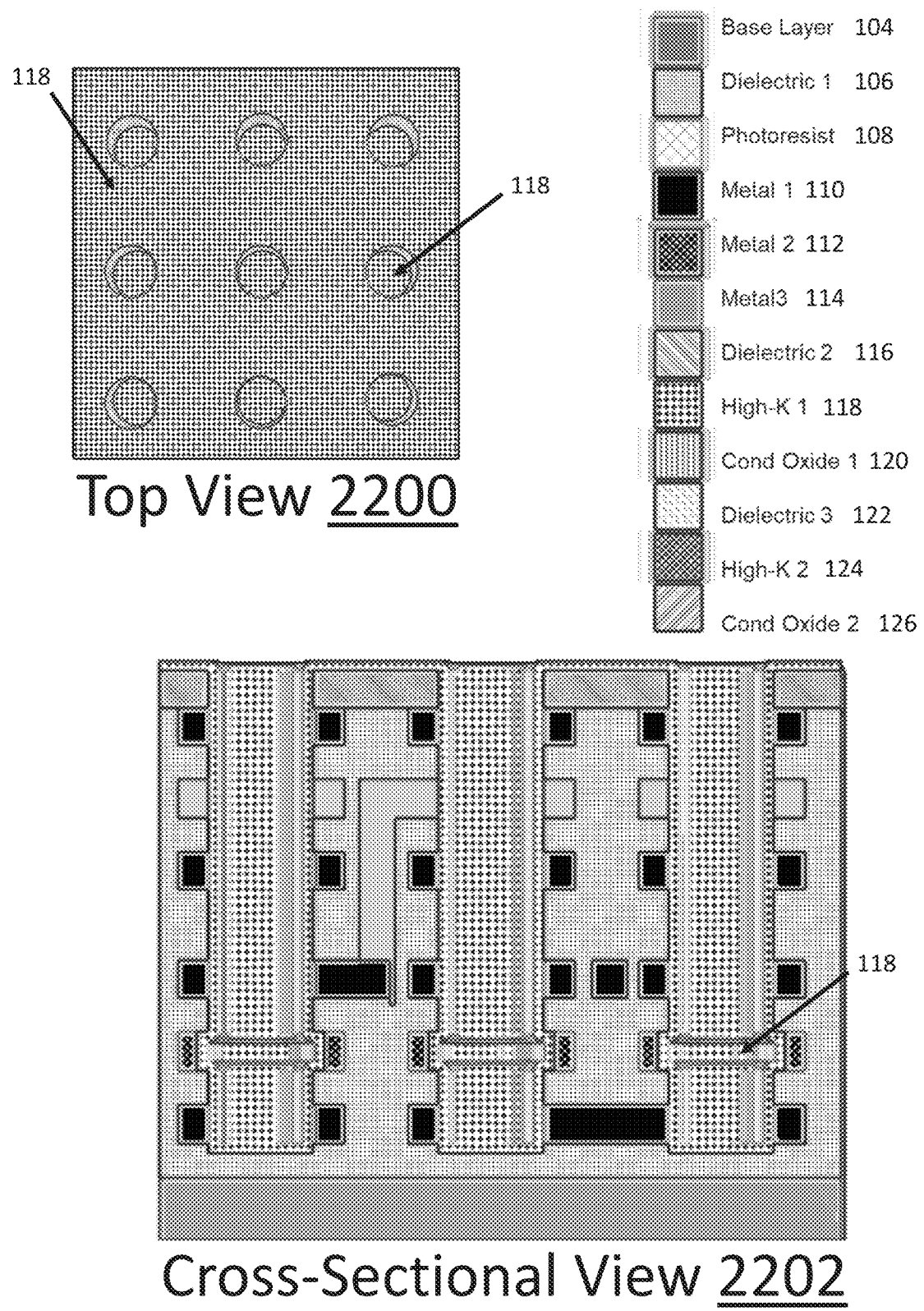

In another configuration, the transistor stacks may be fabricated using the recessed gate techniques described above, but without a selective deposition of the high-K dielectric materials (e.g., the high-K dielectric 118 and the high-K dielectric 124). For example, in configurations, high-K dielectric materials may be desired, but do not possess the chemical properties necessary for selective deposition processes such as those described in connection with FIGS. 18 and 21. In such cases, the high-K dielectric may be deposited using other types of processes, such as ALD processes. These and other aspects are described in connection with FIGS. 22-26. Referring to FIG. 22, depicted is a top view 2200 and a cross-sectional view 2202 of a material stack similar to those described herein, which may be fabricated using any of the process flows described herein (e.g., in connection with FIGS. 1-9, or FIGS. 14 and 15). The gate metal 112 is then selectively etched using a process similar to that described in connection with FIG. 17. However, instead of selectively depositing the high-K dielectric 118 dielectric as shown in FIG. 18, the high-K 1 dielectric may be deposited using an ALD process. Once the ALD process is complete, the high-K dielectric 118 material may coat some, or most of, the material stack, including the recessed portion of the gate metal 112.

Referring to FIG. 23, illustrated is a top view 2300 and a cross-sectional view 2302 of the next stage in the process flow, in which the high-K dielectric 118 is directionally etched to remove the high-K dielectric 118 from the body channel and the surface of the stack, while leaving a predetermined amount of the high-K dielectric 118 within the recess formed by etching the gate metal 112. As shown, the appearance of the high-K dielectric 118 is similar to that described above in connection with FIG. 18. However, unlike the process flows described in connection with FIG. 18, a selective deposition process is not required to create the high-K dielectric gate insulation layer. This process may be advantageous for certain high-K dielectric materials that are unsuitable for selective deposition techniques.

Figure 24:
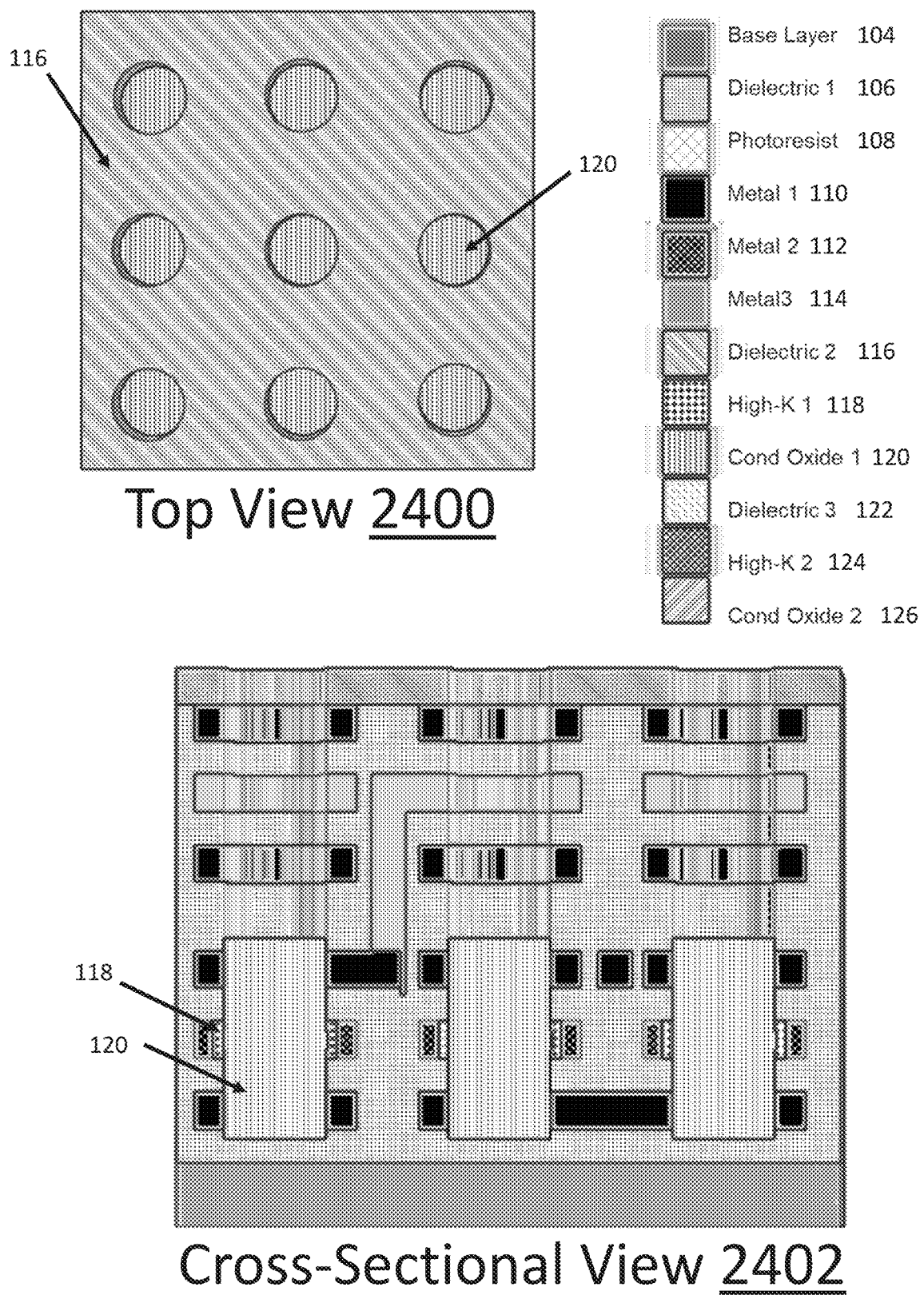

Referring to FIG. 24, illustrated is a top view 2400 and a cross-sectional view 2402 of the next stage of in the process flow, in which the body opening may be deposit filled with a conductive oxide 120 and then subjected to a CMP process. This process may be similar to those described in connection with FIGS. 11 and 19. The deposition of the conductive oxide 120 may be etched near the second layer of metal 110 to form a transistor structure, similar to the transistor structure depicted in FIG. 19. As shown, the high-K dielectric 118 forms a gate dielectric for the transistor structure.

Figure 25:
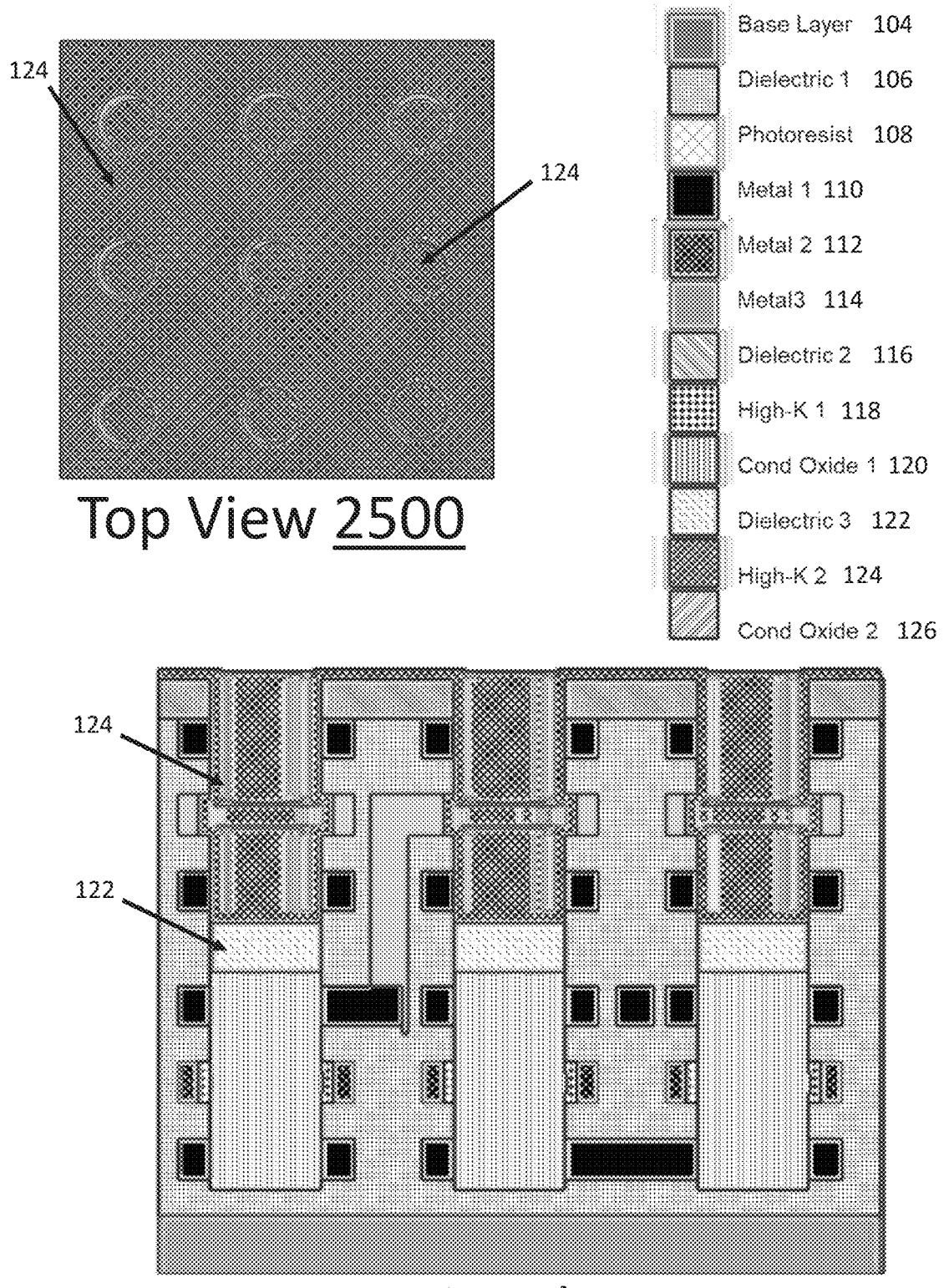

Referring to FIG. 25, illustrated is a top view 2500 and a cross-sectional view 2502 of the next stage in the process flow, in which the body opening may be deposit filled with a layer of the dielectric 122 and then subjected to a CMP process. The dielectric 122 is then etched to a predetermined height (e.g., below the third layer of metal 110). This process can be similar to the processes described in connection with FIGS. 12 and 20. The layer of dielectric 122 acts as an isolation layer between two transistor structures, which also protects the first layer of transistor structures from subsequent etching and processing steps. As shown, the layer of the second gate metal 114 layer is then recessed and a second high-K 124 dielectric is deposited using an ALD process, similar to the processes described in connection with FIG. 22. The etching process used to recess the layer of the gate metal 114 can be selective to the gate metal 114.

Figure 26:
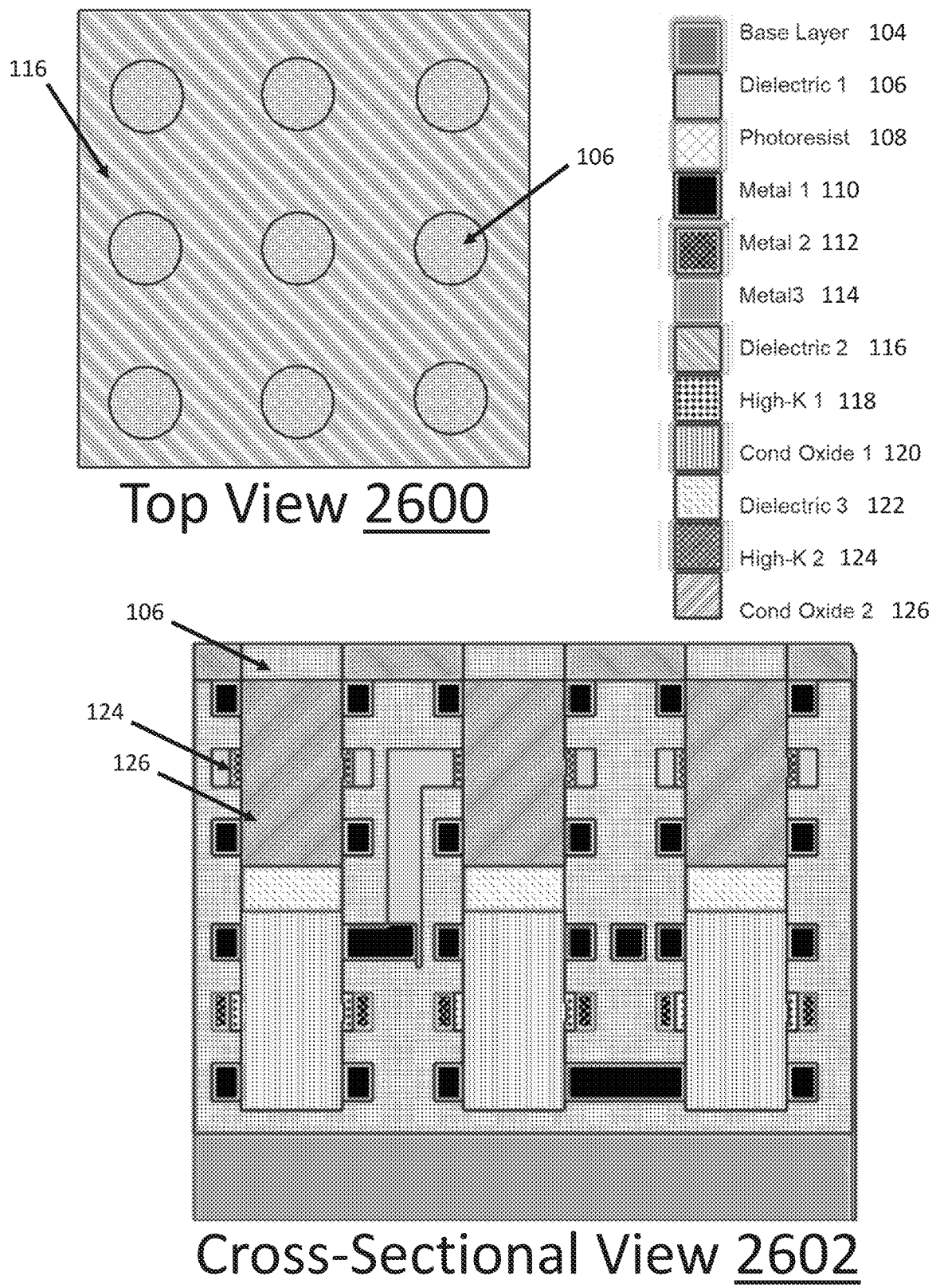

Referring to FIG. 26, illustrated is a top view 2600 and a cross-sectional view 2602 of the next stage in the process flow, in which the second high-K dielectric 124 is directionally etched, using a process similar to that described in connection with FIG. 23. The directional etching process may be a selective etching process. The etching process is used to remove the deposited layer of the second high-K dielectric 124 from the surface of the stack and from the body opening, while leaving a remaining layer of the second high-K dielectric 124 in the recessed region created by etching the second gate metal 114. The second high-K dielectric 124 may be directionally etched to have a predetermined thickness, thereby creating a gate dielectric with desired properties. The body opening is then deposit filled with a second conductive oxide 126, and then subjected to a CMP process. The second conductive oxide 126 is then may be etched to a predetermined height (e.g., flush with, or slightly above, the fourth layer of the metal 110) using a process similar to that described in connection with FIGS. 13, 16 21, and 24, and the remaining gap between the top of the second conductive oxide 126 and the top of the sack is deposit filled with dielectric 106 to protect the conductive oxide 126 and create a flush top surface.

Figure 27:
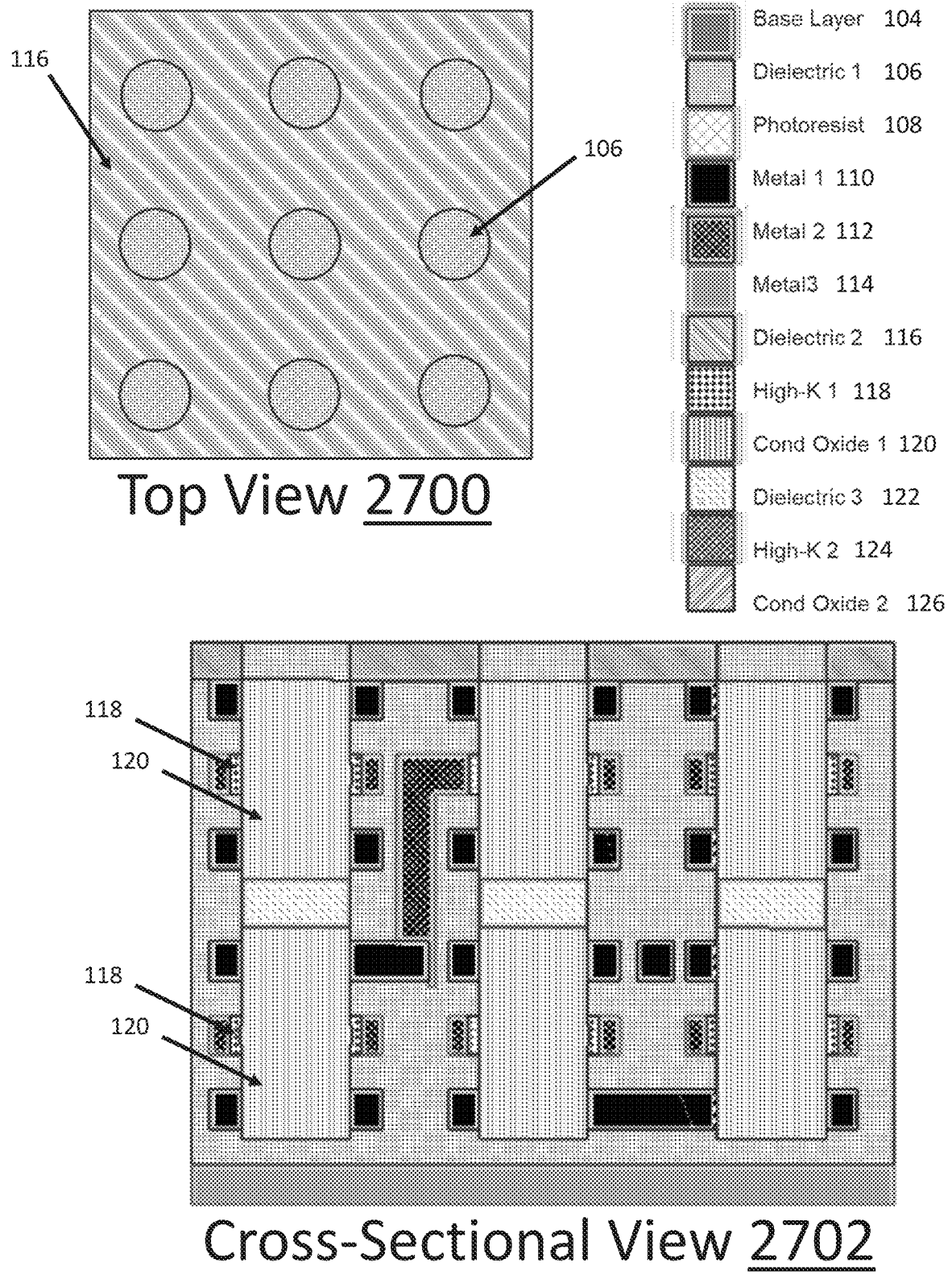
FIG. 27 shows a top and cross-sectional view of a transistor device similar to those fabricated using the processes shown in FIGS. 1-26, in which each transistor stack includes multiple transistors of the same type, according to an embodiment.

In other configuration, and as briefly described herein, the transistor stack structures need not necessarily be a P-type transistor stacked on top of an N-type transistor, or vice versa. Indeed, the transistor stacks may be fabricated to include multiple transistors of the same type. Examples of such devices are shown in FIG. 27. Referring to FIG. 27, illustrated is a top view 2700 and a cross-sectional view 2702 of a device including two adjacent layers of the same type. As shown in the cross-sectional view 2702, the first layer of transistor structures and the second layer of transistor structures have the same conductive oxide 120, the same high-K dielectric 118, and the same gate metals 112. As such, the processes described herein above may be performed with minor modifications, such that the high-K dielectric 118 is grown or deposited on both layers of transistor structures rather than one layer at a time, as in the examples provided above. Here, the high-K dielectrics 118 are shown to be fabricated using one of the gate-recessing processes described in connection with FIGS. 17-21 or FIGS. 21-26.

Figure 28:
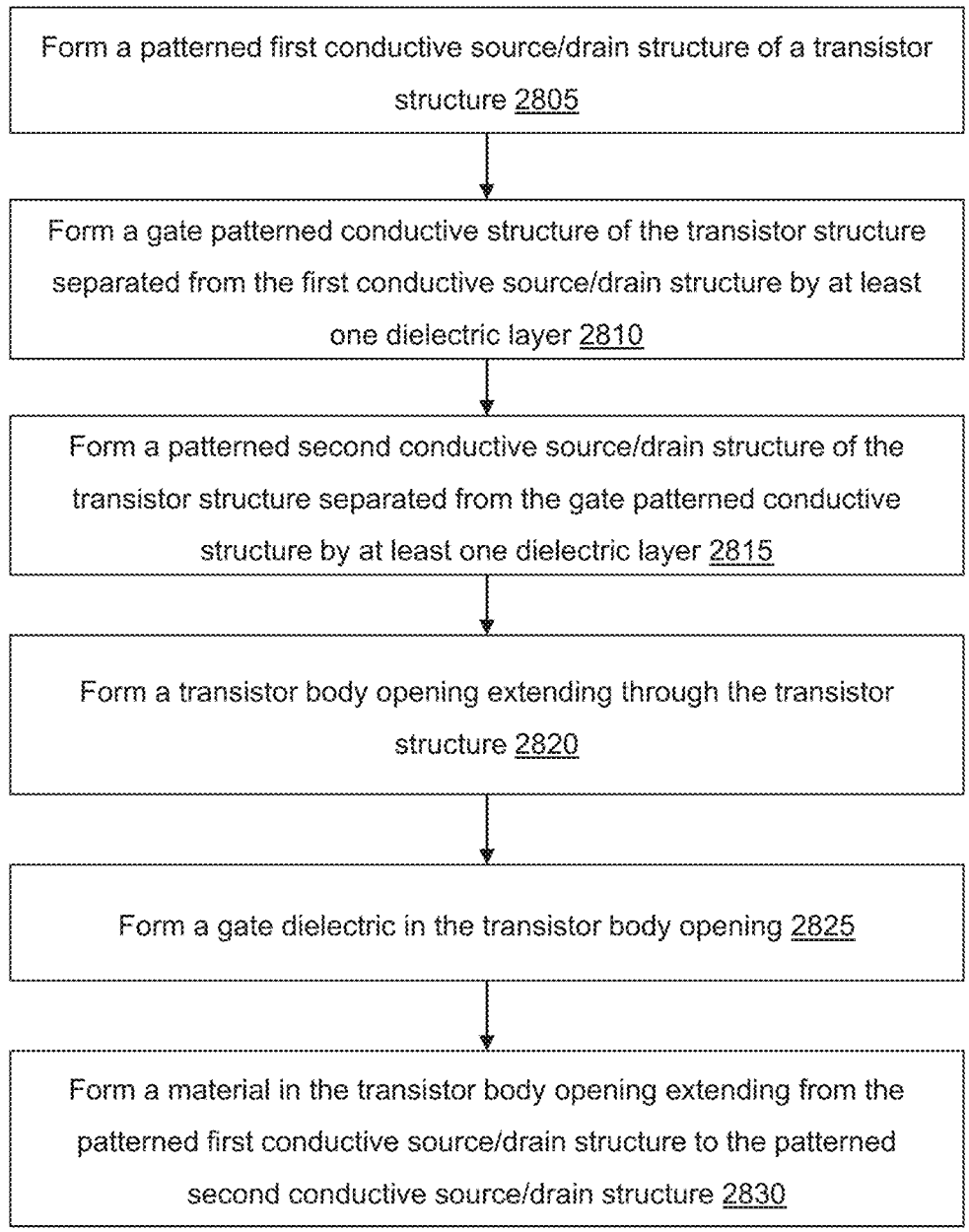

Referring now to FIG. 28, illustrated is a flow diagram of a method 2800 for fabricating 3D semiconductor devices. The method 2800 may include steps 2805-2830. However, other embodiments may include additional or alternative steps, or may omit one or more steps altogether.

At step 2805, the method 2800 includes forming a patterned first conductive source/drain structure of a transistor structure. Such processes may be performed using process flow steps similar to those described herein above in connection with FIGS. 1 and 2 or 14. The patterned conductive source/drain may be formed from a metal layer, such as the first layer of metal 110 shown in FIG. 2. The patterned conductive source/drain structure may be formed on a dielectric layer, such as the dielectric layer 106 that is patterned as shown in FIGS. 1 and 2 or 14. In some implementations, the patterned first conductive source/drain structure may include connections to other source/drain structures of other transistors. Such connections may be formed by patterning one or more metal masks to form desired metal connections, such as connections that may be used to form logical or electronic circuits, as described herein.

At step 2810, the method 2800 includes forming a gate patterned conductive structure of the transistor structure separated from the first conductive source/drain structure by at least one dielectric layer. To do so, process flow steps similar to those described in connection with FIG. 3 or 14 may be performed. For example, after forming the first conductive layer of metal or other conductive material to form the source/drain structure, an additional layer of dielectric material, such as the dielectric material 106 shown in FIG. 3, may be deposited and patterned with a metal mask. The metal mask may define the shape and position of the gate conductive structure, and may define connections to other gate patterned conductive structures. After masking the dielectric layer, a conductive gate layer of metal or other conductive material, such as the metal 112 shown in FIG. 3, may be deposit filled and subjected to a CMP process.

At step 2815, the method 2800 includes forming a patterned second conductive source/drain structure of the transistor structure separated from the gate patterned conductive structure by at least one dielectric layer. To do so, process flow steps similar to those described in connection with FIG. 4 may be performed. For example, after forming the conductive gate layer of metal or other conductive material to form the conductive gate structure, an additional layer of dielectric material, such as the dielectric material 106 shown in FIG. 4, may be deposited and patterned with another metal mask. The metal mask may define the shape and position of the second conductive source/drain structure of the transistor structure, and may define connections to other second conductive source/drain structures. After masking the dielectric layer, a second conductive source/drain layer of metal or other conductive material, such as the metal 110 shown in FIG. 4, may be deposit filled and subjected to a CMP process. In addition to patterning the various source/drain and gate conductive structures on sequential layers in the stack as in steps 2805-2815, connections may be formed between layers to electrically connect portions of the gate conductive layers with the source/drain layers, and to connect portions of the source/drain layers with other source/drain layers of other transistor structures. To do so, process flow steps similar to those described in connection with FIGS. 5-7, may be performed, for example, to create vias between multiple layers of material and to create desired electronic or logical circuits. Any type of connections may be formed between any types of layers, for example, connections between gate structures to gate structures of other transistor structures, as well as connections between the conductive source/drain structures to other conductive source/drain structure of other transistor structures.

At step 2820, the method 2800 includes forming a transistor body opening extending through the transistor structure. To do so, processes similar to those described in connection with FIG. 9 or 15 may be performed. For example, if the first and second source/drain conductive structures and the gate conductive structure are defined such that a portion of the each layer is defined as a dielectric dedicated to the body opening (e.g., using ring structures or similar patterns, as in FIG. 8), the process described in connection with FIG. 9 may be used. In contrast, if a portion of each layer does not include a predetermined pattern for the body opening (e.g., as in FIG. 14), then the etching process described in connection with FIG. 15 may be used to define the body opening. Defining the body opening may include defining an opening for any number of transistor structures, as described herein.

At step 2825, the method 2800 includes forming a gate dielectric in the transistor body opening. The gate dielectric may be formed using techniques similar to those described in connection with FIGS. 10, 17 and 18, or 22 and 23. The gate dielectric can be formed to have a first surface along a sidewall of the transistor body opening and may be at least partially adjacent the gate patterned conductive structure. If utilizing a technique similar to those described in connection with FIGS. 17 and 22, forming the gate dielectric can include recessing the gate patterned conductive structure to form a recess and depositing the gate dielectric in the recess. The gate dielectric can include a first surface adjacent the gate patterned conductive and a second surface that is aligned with a surface of the transistor body opening. The gate dielectric may be selectively formed, for example, using the techniques described in connection with FIG. 10.

At step 2830, the method 2800 includes forming a material, such as the conductive oxide 120 described in connection with FIG. 11, in the transistor body opening extending from the patterned first conductive source/drain structure to the patterned second conductive source/drain structure. To do so, the techniques similar to those described in connection with FIG. 11 may be performed. The material can be a semiconductive-behaving oxide, such as the conductive oxide 120 described in connection with FIG. 11. In some implementations, the method can include forming a second transistor structure, such as a second vertical transistor positioned on top of the first transistor structure. To do so, multiple additional layers of metal and dielectric may be masked and deposited, for example, using the processes described in connection with FIGS. 4-8. The transistor body of the second transistor can be axially aligned with that of the first transistor structure, such that the transistor body opening, when formed, extends through the transistor structure and the second transistor structure.

Referring now to FIG. 29, illustrated is a flow diagram of another method 2900 for fabricating 3D semiconductor devices. The method 2900 may include steps 2905-2925. However, other embodiments may include additional or alternative steps, or may omit one or more steps altogether.

At step 2905, the method 2900 includes forming a first transistor structure including a patterned first conductive source/drain structure, a gate patterned conductive structure separated from the patterned first conductive source/drain structure by at least one dielectric layer, and a patterned second conductive source/drain structure separated from the gate patterned conductive structure by at least one dielectric layer. To form the first transistor structure, each of the conductive source/drain structure, the gate conductive structure, and the second conductive source/drain structure may be constructed using processes similar to those described in connection with FIG. 1-4 or 14. Such process steps can include sequentially patterning mask layers to alternate between layers of a dielectric material and respective metal layers, which form the gate or the source/drain structures of the first transistor structure.

At step 2910, the method 2900 includes forming a second transistor structure including a patterned third conductive source/drain structure, a second gate patterned conductive structure separated from the patterned third conductive source/drain structure by at least one dielectric layer, and a patterned fourth conductive source/drain structure separated from the second gate patterned conductive structure by at least one dielectric layer. To form the second transistor structure, each of the third conductive source/drain structure, the gate conductive structure, and the fourth conductive source/drain structure may be constructed using processes similar to those described in connection with FIG. 4-8 or 14. Such process steps can include sequentially patterning mask layers to alternate between layers of a dielectric material and respective metal layers on top of the first transistor structure created in step 2905, as described above. In addition, various connections between the metal layers (e.g., the source/drain layers of the first or second transistors, the gate layers of the first or second transistor structures) by patterning vias or other connections as descried herein and in connection with FIGS. 5-7. Any type of connections may be formed between any of the layers of the first or second transistor structures (or other transistor structures). For example, connections between the gate patterned conductive structure to another conductive source/drain structure of a third transistor structure may be formed. Likewise, connections between the gate patterned conductive structure to a gate patterned structure of another transistor structure may be formed. In addition, connections between the patterned first conductive source/drain structure and a patterned conductive source/drain structure of another structure may be formed.

At step 2915, the method 2900 includes forming a transistor body opening extending through the first and second transistor structures. To do so, processes similar to those described in connection with FIG. 9 or 15 may be performed. For example, if the first and second source/drain conductive structures and the gate conductive structure are defined such that a portion of the each layer is defined as a dielectric dedicated to the body opening (e.g., using ring structures or similar patterns, as in FIG. 8), the process described in connection with FIG. 9 may be used. In contrast, if a portion of each layer does not include a predetermined pattern for the body opening (e.g., as in FIG. 14), then the etching process described in connection with FIG. 15 may be used to define the body opening. Defining the body opening may include defining an opening for any number of transistor structures, as described herein.

At step 2920, the method 2900 includes forming a gate dielectric (e.g., the first high-K dielectric 118 described in connection with FIGS. 10, 18, and 22) in the transistor body opening. The gate dielectric may be formed using techniques similar to those described in connection with FIGS. 10, 17 and 18, or 22 and 23. The gate dielectric can be formed to have a first surface along a sidewall of the transistor body opening and may be at least partially adjacent the gate patterned conductive structure. If utilizing a technique similar to those described in connection with FIGS. 17 and 22, forming the gate dielectric can include recessing the gate patterned conductive structure to form a recess and depositing the gate dielectric in the recess. The gate dielectric can include a first surface adjacent the gate patterned conductive and a second surface that is aligned with a surface of the transistor body opening. The gate dielectric may be selectively formed, for example, using the techniques described in connection with FIG. 10. The gate dielectric can have a first surface along a sidewall of the transistor body opening and at least partially adjacent the gate patterned conductive structure.

At step 2925, the method 2900 includes forming a material in the transistor body opening extending from the patterned first conductive source/drain structure to the patterned second conductive source/drain structure. To do so, techniques similar to those described in connection with FIG. 11 may be performed. The material can be a semiconductive-behaving oxide, such as the conductive oxide 120 described in connection with FIG. 11. In some implementations, the method can include forming a second transistor structure, such as a second vertical transistor positioned on top of the first transistor structure. To do so, multiple additional layers of metal and dielectric may be masked and deposited, for example, using the processes described in connection with FIGS. 4-8. The transistor body of the second transistor can be axially aligned with that of the first transistor structure, such that the transistor body opening, when formed, extends through the transistor structure and the second transistor structure.

Figure 30:
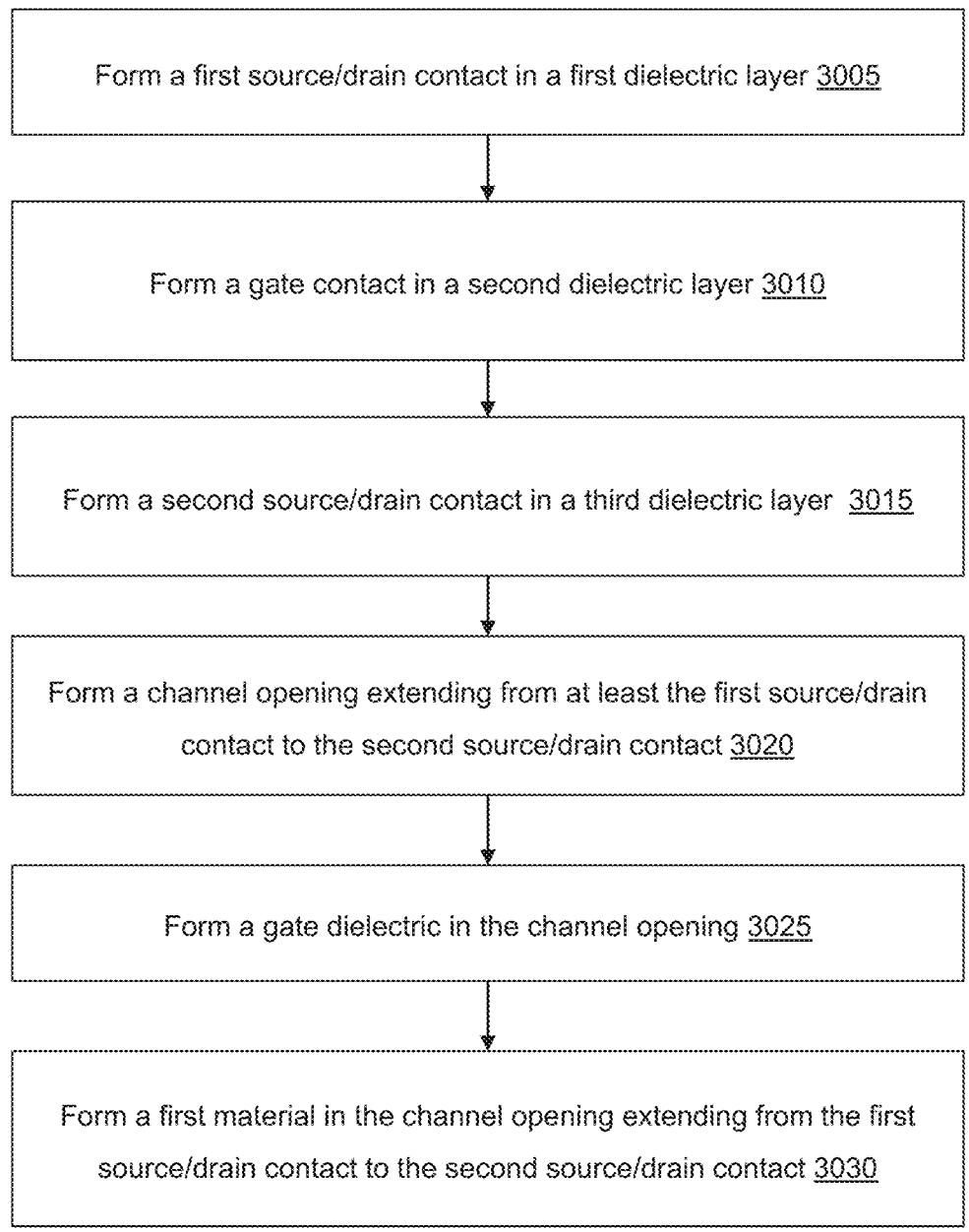

Referring now to FIG. 30, illustrated is a flow diagram of another method 3000 for fabricating 3D semiconductor devices. The method 3000 may include steps 3005-3030. However, other embodiments may include additional or alternative steps, or may omit one or more steps altogether.

At step 3005, the method 3000 can include forming a first source/drain contact in a first dielectric layer. To do so, process flow steps similar to those described in connection with FIGS. 1 and 2 or 14 may be performed. The first source/contact drain may be formed from a metal layer, such as the first layer of metal 110 shown in FIG. 2. The first conductive source/drain contact may be formed on a dielectric layer, such as the dielectric layer 106 that is patterned as shown in FIGS. 1 and 2 or 14. In some implementations, the first source/drain contact may include connections to other source/drain contacts of other transistors. Such connections may be formed by patterning one or more metal masks to form desired metal connections, such as connections that may be used to form logical or electronic circuits, as described herein.

At step 3010, the method 3000 can include forming a gate contact in a second dielectric layer. To do so, process flow steps similar to those described in connection with FIG. 3 or 14 may be performed. For example, after forming the first conductive layer of metal or other conductive material to form the source/drain contact, an additional layer of dielectric material, such as the dielectric material 106 shown in FIG. 3, may be deposited and patterned with a metal mask. The metal mask may define the shape and position of the gate contacts, and may define connections to other gate contacts in other transistor structures. After masking the dielectric layer, a conductive gate layer of metal or other conductive material, such as the metal 112 shown in FIG. 3, may be deposit filled and subjected to a CMP process to form the gate contacts. In some implementations, connections between the between the first source/drain contact (or other source/drain contacts of other transistor structures) and the gate contact may be formed using processes similar to those described in connection with FIGS. 4 and 5.

At step 3015, the method 3000 can include forming a second source/drain contact in a third dielectric layer. To do so, process flow steps similar to those described in connection with FIG. 4 may be performed. For example, after forming the conductive gate layer of metal or other conductive material to form the conductive gate contacts in step 3010, an additional layer of dielectric material, such as the dielectric material 106 shown in FIG. 4, may be deposited and patterned with another metal mask. The metal mask may define the shape and position of the second source/drain contact, and may define connections to other source/drain contacts in the same or different layers. After masking the dielectric layer, a second conductive source/drain layer of metal or other conductive material, such as the metal 110 shown in FIG. 4, may be deposit filled and subjected to a CMP process to form the second source/drain contacts. Process flow steps similar to those described in connection with FIGS. 5-7 may be performed to electrically connect the second source/drain contacts with other layers and contacts, such as the gate contacts or the first source/drain contacts of other transistor structures, among others.

At step 3020, the method 3000 can include forming a channel opening extending from at least the first source/drain contact to the second source/drain contact. To do so, processes similar to those described in connection with FIG. 9 or 15 may be performed. For example, if the first and second source/drain conductive contacts and the gate conductive contacts are defined such that a portion of the each layer is defined such that a portion of the each layer is defined as a dielectric dedicated to the channel (e.g., using ring structures or similar patterns, as in FIG. 8), the process described in connection with FIG. 9 may be used to form the channel opening (e.g., which may include etching through dielectric layers of the device, but not necessarily metal contact layers). In contrast, if a portion of each layer does not include a predetermined pattern for the channel opening (e.g., as in FIG. 14), then the etching process described in connection with FIG. 15 may be used to define the channel opening (e.g., which may include etching through both the dielectric layers, the first and second source/drain contacts, and the gate contacts). Defining the channel opening may include defining an opening for any number of transistor axially aligned structures, as described herein.

At step 3025, the method 3000 can include forming a gate dielectric (e.g., the first high-K dielectric 118 described in connection with FIGS. 10, 18, and 22) in the channel opening. The gate dielectric may be formed using techniques similar to those described in connection with FIGS. 10, 17 and 18, or 22 and 23. The gate dielectric can be formed to have a first surface along a sidewall of the transistor body opening and may be at least partially adjacent the gate patterned conductive structure. If utilizing a technique similar to those described in connection with FIGS. 17 and 22, forming the gate dielectric can include recessing the gate patterned conductive structure to form a recess and depositing the gate dielectric in the recess. The gate dielectric can include a first surface adjacent the gate patterned conductive and a second surface that is aligned with a surface of the transistor body opening. The gate dielectric may be selectively formed, for example, using the techniques described in connection with FIG. 10. The gate dielectric can have a first surface along a sidewall of the transistor body opening and at least partially adjacent the gate patterned conductive structure.

At step 3030, the method 3000 can include forming a first material in the channel opening extending from the first source/drain contact to the second source/drain contact. To do so, techniques similar to those described in connection with FIG. 11 may be performed. The material can be a semiconductive-behaving oxide, such as the conductive oxide 120 described in connection with FIG. 11. In some implementations, the method can include forming a second transistor structure on top of the second source/drain contacts. To do so, multiple additional layers of metal and dielectric may be masked and deposited, for example, using the processes described in connection with FIGS. 4-8. The transistor body of the second transistor can be axially aligned with that of the first transistor structure, such that the transistor body opening, when formed, extends through the transistor structure and the second transistor structure.

Referring now to FIG. 31, illustrated is a flow diagram of another method 3000 for fabricating 3D semiconductor devices. The method 3100 may include steps 3105-3130. However, other embodiments may include additional or alternative steps, or may omit one or more steps altogether.

At step 3105, the method 3100 includes forming contacts of at least two patterned transistor structures. The first contacts of a first patterned transistor structure and second contacts of a second patterned transistor structure are axially-aligned. To do so, techniques similar to those described in connection with FIG. 1-8 or 14 may be performed. For example, alternating layers of a dielectric material (e.g., the dielectric 106 of FIGS. 1-8) and metal layers (e.g., the metal 110 for source/drain contacts and the metal 112 or the metal 114 for gate contacts) may be masked and deposited to form structures similar to those depicted in FIG. 1-8 or 14 using the techniques described herein. In addition, forming the contacts can include forming connection between the first contacts and at least one contact of a third transistor structure formed using similar techniques. To form such connections between layers, techniques similar to those described in connection with FIGS. 4 and 5 may be performed. The first patterned transistor structure and the third patterned transistor structure can be axially-aligned, and can form a stack of at least three transistors (e.g., N is greater than or equal to three).

At step 3110, the method 3100 includes forming a channel opening extending through the at least two patterned transistor structures. To do so, techniques similar to those described in connection with FIG. 9 or 15 may be performed. For example, if the contacts formed in step 3105 are defined such that a portion of the each layer is defined as a dielectric dedicated to the channel opening (e.g., using ring structures or similar patterns, as in FIG. 8), the process described in connection with FIG. 9 may be used. In contrast, if a portion of each layer does not include a predetermined pattern for the channel opening (e.g., as in FIG. 14), then the etching process described in connection with FIG. 15 may be used to define the channel opening. Defining the channel opening may include defining an opening for any number of transistor structures, as described herein.

At step 3115, the method 3100 includes forming a gate dielectric associated with a contact of the first contacts. The gate dielectric may be formed using techniques similar to those described in connection with FIGS. 10, 17 and 18, or 22 and 23. The gate dielectric may be formed for the first transistor structure. The gate dielectric may have a first surface along a sidewall of the channel opening and be at least partially adjacent to a gate contact of the first contacts. If utilizing a technique similar to those described in connection with FIGS. 17 and 22, forming the gate dielectric can include recessing a gate contact of the first contacts to form a recess and depositing the gate dielectric in the recess. The gate dielectric may have a first surface adjacent to the gate contact of the first contacts and a second surface aligned with a surface of the channel opening. The gate dielectric may be selectively formed, for example, using the techniques described in connection with FIG. 10.

At step 3120, the method 3100 includes forming a gate dielectric associated with a contact of the second contacts. The gate dielectric may be formed using techniques similar to those described in connection with FIGS. 10, 17 and 18, or 22 and 23. The gate dielectric may be formed for the second transistor structure. The gate dielectric may have a first surface along a sidewall of the channel opening and be at least partially adjacent to a gate contact of the second contacts. If utilizing a technique similar to those described in connection with FIGS. 17 and 22, forming the gate dielectric can include recessing a gate contact of the second contacts to form a recess and depositing the gate dielectric in the recess. The gate dielectric may have a first surface adjacent to the gate contact of the second contacts and a second surface aligned with a surface of the channel opening. The gate dielectric may be selectively formed, for example, using the techniques described in connection with FIG. 10.

At step 3125, the method 3100 includes forming a first material, in the channel opening aligned with the first contacts. The first material may be formed after forming the connections between various contacts in the patterned transistor structures. To do so, techniques similar to those described in connection with FIG. 11 may be performed. The first material can be a semiconductive-behaving oxide, such as the conductive oxide 120 described in connection with FIG. 11. The first material may be an N-type semiconductive oxide or a P-type semiconductive oxide. A dielectric isolation or protection layer (e.g., the dielectric 122 described in connection with FIG. 12) may be deposited over the first material.

At step 3130, the method 3100 includes forming a second material in the channel opening aligned with the second contacts. To do so, techniques similar to those described in connection with FIG. 13 may be performed. The second material can be a semiconductive-behaving oxide, such as the conductive oxide 127 described in connection with FIG. 13. The first material may be an N-type semiconductive oxide or a P-type semiconductive oxide. A dielectric protection layer (e.g., the dielectric 106 described in connection with FIG. 13) may be deposited over the second material.

Having now described some illustrative implementations and implementations, it is apparent that the foregoing is illustrative and not limiting, having been presented by way of example. In particular, although many of the examples presented herein involve specific combinations of method acts or system elements, those acts and those elements may be combined in other ways to accomplish the same objectives. Acts, elements and features discussed only in connection with one implementation are not intended to be excluded from a similar role in other implementations or implementations.

The phraseology and terminology used herein is for the purpose of description and should not be regarded as limiting. The use of "including" "comprising" "having" "containing" "involving" "characterized by" "characterized in that" and variations thereof herein, is meant to encompass the items listed thereafter, equivalents thereof, and additional items, as well as alternate implementations consisting of the items listed thereafter exclusively. In one implementation, the systems and methods described herein consist of one, each combination of more than one, or all of the described elements, acts, or components.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Any references to implementations or elements or acts of the systems and methods herein referred to in the singular may also embrace implementations including a plurality of these elements, and any references in plural to any implementation or element or act herein may also embrace implementations including only a single element. References in the singular or plural form are not intended to limit the presently disclosed systems or methods, their components, acts, or elements to single or plural configurations. References to any act or element being based on any information, act or element may include implementations where the act or element is based at least in part on any information, act, or element.

Any implementation disclosed herein may be combined with any other implementation, and references to "an implementation," "some implementations," "an alternate implementation," "various implementation," "one implementation" or the like are not necessarily mutually exclusive and are intended to indicate that a particular feature, structure, or characteristic described in connection with the implementation may be included in at least one implementation. Such terms as used herein are not necessarily all referring to the same implementation. Any implementation may be combined with any other implementation, inclusively or exclusively, in any manner consistent with the aspects and implementations disclosed herein.

References to "or" may be construed as inclusive so that any terms described using "or" may indicate any of a single, more than one, and all of the described terms.

Where technical features in the drawings, detailed description or any claim are followed by reference signs, the reference signs have been included for the sole purpose of increasing the intelligibility of the drawings, detailed description, and claims. Accordingly, neither the reference signs nor their absence have any limiting effect on the scope of any claim elements.

The preceding description of the disclosed embodiments is provided to enable any person skilled in the art to make or use the embodiments described herein and variations thereof. Various modifications to these embodiments will be readily apparent to those skilled in the art, and the principles defined herein may be applied to other embodiments without departing from the spirit or scope of the subject matter disclosed herein. Thus, the present disclosure is not intended to be limited to the embodiments shown herein but is to be accorded the widest scope consistent with the following claims and the principles and novel features disclosed herein.

While various aspects and embodiments have been disclosed, other aspects and embodiments are contemplated. The various aspects and embodiments disclosed are for purposes of illustration and are not intended to be limiting, with the true scope and spirit being indicated by the following claims.

What is claimed is:

1. A method comprising:
forming a patterned first conductive source/drain structure of a transistor structure;
forming a gate patterned conductive structure of the transistor structure separated from the first conductive source/drain structure by at least one dielectric layer;
forming a patterned second conductive source/drain structure of the transistor structure separated from the gate patterned conductive structure by at least one dielectric layer;
forming a transistor body opening extending through the transistor structure;
forming a gate dielectric in the transistor body opening; and
forming a material in the transistor body opening extending from the patterned first conductive source/drain structure to the patterned second conductive source/drain structure.

2. The method of claim 1, wherein the gate dielectric has a first surface along a sidewall of the transistor body opening and at least partially adjacent the gate patterned conductive structure.

3. The method of claim 1, wherein forming the gate dielectric includes recessing the gate patterned conductive structure to form a recess and depositing the gate dielectric in the recess, wherein the gate dielectric has a first surface adjacent the gate patterned conductive structure and a second surface aligned with a surface of the transistor body opening.

4. The method of claim 1, wherein the gate dielectric is selectively formed.

5. The method of claim 1, further comprising forming a connection between the gate patterned conductive structure to a patterned conductive source/drain structure of a second transistor structure before forming the material.

6. The method of claim 1, further comprising forming a connection between the gate patterned conductive structure to a gate patterned structure of a second transistor structure before forming the material.

7. The method of claim 1, further comprising forming a connection between the patterned first conductive source/drain structure to a patterned conductive source/drain structure of a second transistor structure before forming the material.

8. The method of claim 1, further comprising forming a second transistor structure, wherein the transistor body opening extends through the transistor structure and the second transistor structure.

9. The method of claim 1, wherein the material is a semiconductive-behaving oxide.

10. A method comprising:
forming a first transistor structure comprising:
a patterned first conductive source/drain structure;
a gate patterned conductive structure separated from the patterned first conductive source/drain structure by at least one dielectric layer; and
a patterned second conductive source/drain structure separated from the gate patterned conductive structure by at least one dielectric layer;
forming a second transistor structure comprising:
a patterned third conductive source/drain structure;
a second gate patterned conductive structure separated from the patterned third conductive source/drain structure by at least one dielectric layer; and
a patterned fourth conductive source/drain structure separated from the second gate patterned conductive structure by at least one dielectric layer;
forming a transistor body opening extending through the first and second transistor structures;
forming a gate dielectric in the transistor body opening; and
forming a material in the transistor body opening extending from the patterned first conductive source/drain structure to the patterned second conductive source/drain structure.

11. The method of claim 10, wherein the gate dielectric has a first surface along a sidewall of the transistor body opening and at least partially adjacent the gate patterned conductive structure.

12. The method of claim 10, wherein forming the gate dielectric includes recessing the gate patterned conductive structure to form a recess and depositing the gate dielectric in the recess, wherein the gate dielectric has a first surface adjacent the gate patterned conductive structure and a second surface aligned with a surface of the transistor body opening.

13. The method of claim 10, wherein the gate dielectric is selectively formed.

14. The method of claim 10, further comprising forming a connection between the gate patterned conductive structure to a patterned conductive source/drain structure of a third transistor structure before forming the material.

15. The method of claim 10, further comprising forming a connection between the gate patterned conductive structure to a gate patterned structure of a third transistor structure before forming the material.

16. The method of claim 10, further comprising forming a connection between the patterned first conductive source/drain structure to a patterned conductive source/drain structure of a third transistor structure before forming the material.

17. The method of claim 10, wherein the material is a semiconductive-behaving oxide.

18. A method comprising:
forming a first source/drain contact in a first dielectric layer;
forming a gate contact in a second dielectric layer;

forming a second source/drain contact in a third dielectric layer;

forming a channel opening extending from at least the first source/drain contact to the second source/drain contact;

forming a gate dielectric in the channel opening; and forming a first material in the channel opening extending from the first source/drain contact to the second source/drain contact.

19. The method of claim 18, wherein forming the channel opening comprises etching through a dielectric surrounded by the first source/drain contact, a dielectric surrounded by the gate contact, and a dielectric surrounded by the second source/drain contact.

20. The method of claim 18, wherein forming the channel opening comprises etching through a first dielectric region of the first dielectric layer, a second dielectric region of the second dielectric layer, and a third dielectric region of the third dielectric layer.

21. The method of claim 18, wherein forming the channel opening comprises etching through the first source/drain contact, the gate contact, and the second source/drain contact.

22. The method of claim 18, further comprising forming a connection between the first source/drain contact or the gate contact and a third source/drain contact or a second gate contact.

23. The method of claim 18, further comprising forming a connection between the first source/drain contact or the first gate contact and the third source/drain contact or the second gate contact.

24. A method comprising:

forming contacts of at least two patterned transistor structures, wherein first contacts of a first patterned transistor structure and second contacts of a second patterned transistor structure are axially-aligned;

forming a channel opening extending through the at least two patterned transistor structures;

forming a gate dielectric associated with a contact of the first contacts;

forming a gate dielectric associated with a contact of the second contacts;

forming a first material in the channel opening aligned with the first contacts; and forming a second material in the channel opening aligned with the second contacts.

25. The method of claim 24, further comprising forming a connection between at least one contact of the first contacts and at least one contact of third contacts of a third patterned transistor structure.

26. The method of claim 25, wherein the first patterned transistor structure and the third patterned transistor structure are axially-aligned.

27. The method of claim 25, wherein forming the first material is performed after forming the connection.

28. The method of claim 24, wherein forming the first contacts comprises depositing the first contacts in respective dielectric layers.

29. The method of claim 24, further comprising forming the gate dielectric for the first transistor structure, wherein the gate dielectric has a first surface along a sidewall of the channel opening and at least partially adjacent a gate contact of the first contacts.

30. The method of claim 24, wherein the gate dielectric has a first surface adjacent a gate contact of the first contacts and a second surface aligned with a surface of the channel opening.

31. The method of claim 30, wherein forming the gate dielectric includes recessing the contact of the first contacts to form a recess and depositing the gate dielectric in the recess, wherein the gate dielectric has a first surface adjacent the contact and a second surface aligned with a surface of the channel opening.

* * * * *